United States Patent
Kawada et al.

(10) Patent No.: US 12,159,771 B2
(45) Date of Patent: Dec. 3, 2024

(54) PLASMA PROCESSING APPARATUS

(71) Applicant: Tokyo Electron Limited, Tokyo (JP)

(72) Inventors: Yuki Kawada, Miyagi (JP); Naoto Hayasaka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 351 days.

(21) Appl. No.: 17/835,251

(22) Filed: Jun. 8, 2022

(65) Prior Publication Data
US 2022/0399191 A1 Dec. 15, 2022

(30) Foreign Application Priority Data
Jun. 8, 2021 (JP) .................. 2021-095895

(51) Int. Cl.
*H01J 37/32* (2006.01)
(52) U.S. Cl.
CPC ..... *H01J 37/32651* (2013.01); *H01J 37/3211* (2013.01)
(58) Field of Classification Search
CPC ............ H01J 37/321; H01J 37/3244; H01J 37/32651; H01J 37/3211; H01J 37/32091; H01J 2237/334; H01J 37/32568; H01J 2237/332; H01J 37/32174; H01J 37/32669; H01J 37/32119; H01J 37/32495; H01J 37/32541; H01J 37/3266; H01J 37/32715; H05H 1/46; H05H 1/4652; C23C 16/52; C23C 14/0068; C23C 14/0641; C23C 16/4401; C23C 16/505; H01L 21/67069; H01L 21/67109; H01L 21/6831; H01L 21/0217; H01L 21/02247; H01L 21/3065; H01L 21/308; H01L 21/31; H01L 21/68742
See application file for complete search history.

(56) References Cited

U.S. PATENT DOCUMENTS

| | | | |
|---|---|---|---|
| 2008/0180030 A1* | 7/2008 | Tetsuka | H01J 37/32495 315/111.41 |
| 2010/0089870 A1* | 4/2010 | Hiroshima | C23C 16/507 216/68 |

FOREIGN PATENT DOCUMENTS

JP 2004-22988 A 1/2004

* cited by examiner

Primary Examiner — Lincoln D Donovan
Assistant Examiner — Tyler J Pereny
(74) Attorney, Agent, or Firm — XSENSUS LLP

(57) ABSTRACT

There is provided a plasma processing apparatus comprising: a plasma processing chamber having an upper wall, a sidewall, and a lower wall and having therein a plasma processing space; and a magnetic shield disposed around an outer side of the sidewall and having an opening at an upper side thereof. On the assumption that an angle between a line that passes through a midpoint of an inner surface of the upper wall on the plasma processing space side and connects end points of the opening and the inner surface is θ[°] and a product μi×t of an initial relative permeability μi of a magnetic material forming the magnetic shield and a thickness t[m] of the magnetic shield is Pmc[m], the angle θ[°] satisfies a condition $\theta > 764 \times Pmc^{-2} + 179 \times Pmc^{-1} + 21.3$.

13 Claims, 20 Drawing Sheets

PLASMA PROCESSING APPARATUS

CROSS-REFERENCE TO RELATED APPLICATION

This application claims priority to Japanese Patent Application No. 2021-095895 filed on Jun. 8, 2021, the entire contents of which are incorporated herein by reference.

TECHNICAL FIELD

The present disclosure relates to a plasma processing apparatus.

BACKGROUND

There is known a plasma substrate processing apparatus including a magnetic shield disposed outside a processing chamber and a coil to cover the entire outer periphery of the processing chamber (see, e.g., Japanese Laid-open Patent Publication No. 2004-022988).

SUMMARY

The present disclosure provides a technique for suppressing the influence of an external magnetic field in a plasma processing apparatus.

In accordance with an aspect of the present disclosure, there is provided a plasma processing apparatus comprising: a plasma processing chamber having an upper wall, a sidewall, and a lower wall and having therein a plasma processing space; and a magnetic shield disposed around an outer side of the sidewall and having an opening at an upper side thereof. On the assumption that an angle between a line that passes through a midpoint of an inner surface of the upper wall on the plasma processing space side and connects end points of the opening and the inner surface is θ[°] and a product μi×t of an initial relative permeability μi of a magnetic material forming the magnetic shield and a thickness t[m] of the magnetic shield is Pmc[m], the angle θ[°] satisfies a condition θ>764×Pmc$^{-2}$+179×Pmc$^{-1}$+21.3.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
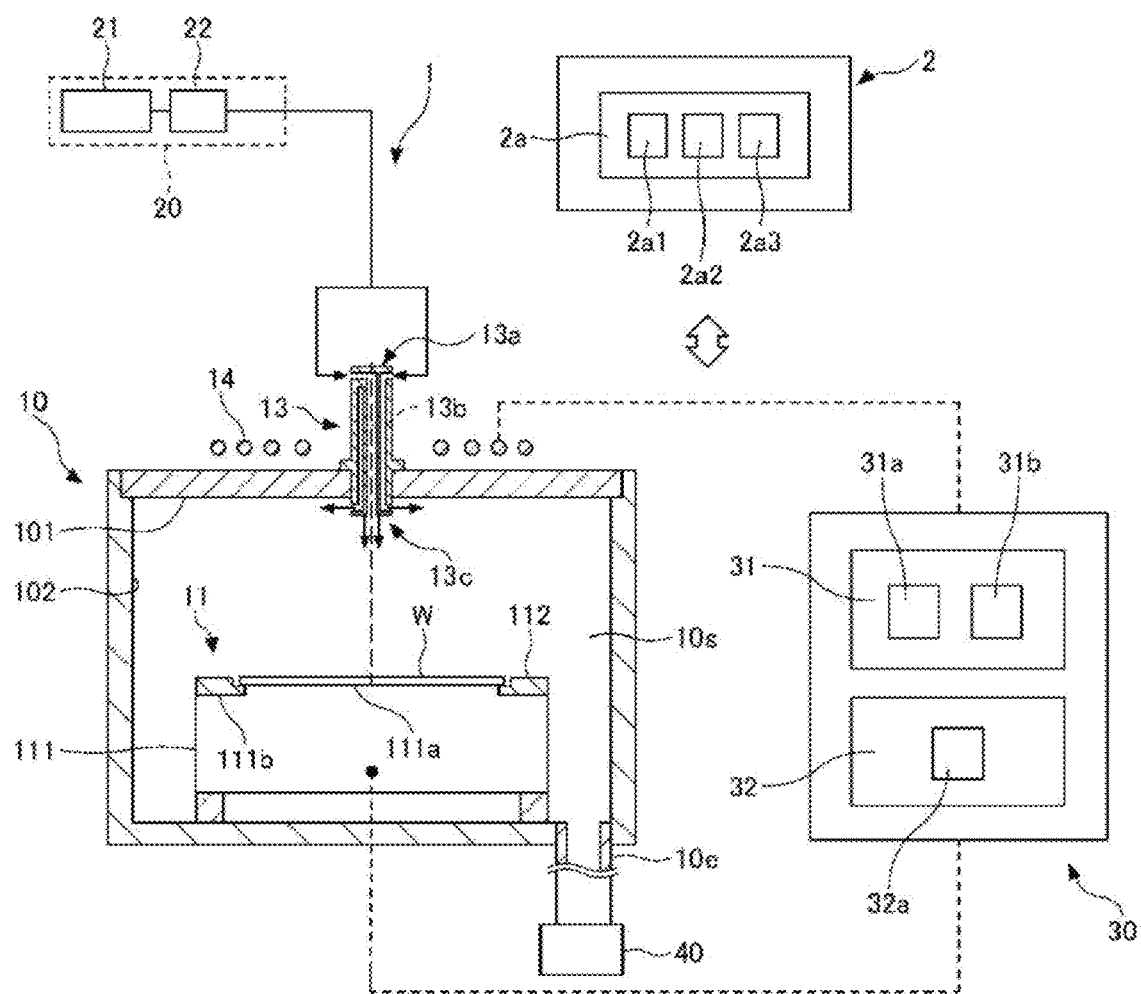
FIG. 1 shows an example of a plasma processing system according to an embodiment.

Hereinafter, non-limiting exemplary embodiments of the present disclosure will be described with reference to the accompanying drawings. Like reference numerals will be given to like or corresponding parts throughout the drawings, and redundant description thereof will be omitted.

For ease of understanding, the scale of individual components in the drawings may be different from the actual scale. Directions such as parallel, right-angled, orthogonal, horizontal, vertical, up and down, and left and right are allowed to deviate without spoiling the effect of the embodiment. The shape of a corner is not limited to a right angle and may be rounded in an arch shape. The terms parallel, right-angled, orthogonal, horizontal, and vertical may include substantially parallel, substantially right-angled, substantially orthogonal, substantially horizontal, and substantially vertical, respectively.

(Plasma Processing System)

Hereinafter, a configuration example of a plasma processing system will be described. FIG. 1 shows an example of a plasma processing system according to an embodiment.

The plasma processing system includes an inductively coupled plasma processing apparatus 1 and a controller 2. The inductively coupled plasma processing apparatus 1 includes a plasma processing chamber 10, a gas supplier 20, a power supply 30, and an exhaust system 40. The plasma processing chamber 10 includes a dielectric window. The plasma processing apparatus 1 further includes a substrate support 11, a gas inlet portion, and an antenna 14. The substrate support 11 is disposed in the plasma processing chamber 10. The antenna 14 is disposed on or above the plasma processing chamber 10 (i.e., on or above a dielectric window 101). The plasma processing chamber 10 has a plasma processing space 10s defined by the dielectric window 101, a sidewall 102 of the plasma processing chamber 10, and the substrate support 11. The plasma processing chamber 10 has at least one gas supply port for supplying at least one processing gas to the plasma processing space 10s, and at least one gas discharge port for discharging a gas from the plasma processing space.

The substrate support 11 includes a main body 111 and a ring assembly 112. The main body 111 has a central region (substrate supporting surface) 111a for supporting a substrate (wafer) W and an annular region (ring supporting surface) 111b for supporting the ring assembly 112. The annular region 111b of the main body 111 surrounds a central region 111a of the main body 111 in plan view. The substrate W is disposed on the central region 111a of the main body 111, and the ring assembly 112 is disposed on the annular region 111b of the main body 111 to surround the substrate W on the central region 111a of the main body 111. In one embodiment, the main body 111 includes a base and an electrostatic chuck. The base includes a conductive member. The conductive member of the base functions as a lower electrode. The electrostatic chuck is placed on the base. An upper surface of the electrostatic chuck has the substrate supporting surface 111a. The ring assembly 112 includes one or more annular members. At least one of them is an edge ring. Although it is not illustrated, the substrate support 11 may include a temperature control module configured to adjust at least one of the electrostatic chuck, the ring assembly 112, and the substrate to a target temperature. The temperature control module may include a heater, a heat transfer medium, a flow path, or a combination thereof. A heat transfer fluid such as brine or a gas flow through the flow path. The substrate support 11 may include a heat transfer gas supplier configured to supply a heat transfer gas to a gap between the backside of the substrate W and the substrate supporting surface 111*a*.

The gas inlet portion is configured to introduce at least one processing gas from the gas supplier 20 into the plasma processing space 10*s*. In one embodiment, the gas inlet portion includes a center gas injector (CGI) 13. The center gas injector 13 is disposed above the substrate support 11 and attached to a central opening formed in the dielectric window 101. The center gas injector 13 has at least one gas supply port 13*a*, at least one gas flow path 13*b*, and at least one gas inlet port 13*c*. The processing gas supplied to the gas supply port 13*a* passes through the gas flow path 13*b* and is introduced into the plasma processing space 10*s* from the gas inlet port 13*c*. The gas inlet portion may include, in addition to the center gas injector 13, one or multiple side gas injectors (SGI) attached to one or multiple openings formed in the sidewall 102.

The gas supplier 20 may include at least one gas source 21 and at least one flow controller 22. In one embodiment, the gas supplier 20 is configured to supply at least one processing gas from the corresponding gas source 21 to the center gas injector 13 through the corresponding flow rate controller 22. The flow rate controllers 22 may include, e.g., a mass flow controller or a pressure-controlled flow rate controller. Further, the gas supplier 20 may include one or more flow rate modulation devices for modulating the flow rate of at least one processing gas or causing it to pulsate.

The power supply 30 includes an RF power supply 31 connected to the plasma processing chamber 10 through at least one impedance matching circuit. The RF power supply 31 is configured to supply at least one RF signal (RF power), such as a source RF signal and a bias RF signal, to the conductive member of the substrate support 11 and/or the antenna 14. Accordingly, plasma is produced from at least one processing gas supplied to the plasma processing space 10*s*. Therefore, the RF power supply 31 may function as at least a part of a plasma generator configured to generate plasma from one or more processing gases in the plasma processing chamber 10. Further, by supplying the bias RF signal to the conductive member of the substrate support 11, a bias potential is generated at the substrate W, and ions in the produced plasma can be attracted to the substrate W.

In one embodiment, the RF power supply 31 includes a first RF generator 31*a* and a second RF generator 31*b*. The first RF generator 31*a* is connected to the antenna 14 through at least one impedance matching circuit, and is configured to generate a source RF signal (source RF power) for plasma generation. In one embodiment, the source RF signal has a frequency within a range of 13 MHz to 150 MHz. In one embodiment, the first RF generator 31*a* may be configured to generate a plurality of source RF signals having different frequencies. The generated one or multiple source RF signals are supplied to the antenna 14. The second RF generator 31*b* is connected to the conductive member of the substrate support 11 through at least one impedance matching circuit, and is configured to generate a bias RF signal (bias RF power). In one embodiment, the bias RF signal has a frequency lower than that of the source RF signal. In one embodiment, the bias RF signal has a frequency within a range of 400 kHz to 13.56 MHz. In one embodiment, the second RF generator 31*b* may be configured to generate a plurality of bias RF signals having different frequencies. The generated one or multiple bias RF signals are supplied to the conductive member of the substrate support 11. Further, in various embodiments, at least one of the source RF signal and the bias RF signal may pulsate.

The power supply 30 may include a DC power supply 32 connected to the plasma processing chamber 10. The DC power supply 32 includes a bias DC generator 32*a*. In one embodiment, the bias DC generator 32*a* is connected to the conductive member of the substrate support 11 and is configured to generate a bias DC signal. The generated bias DC signal is applied to the conductive member of the substrate support 11. In one embodiment, the bias DC signal may be applied to another electrode, such as an electrode in an electrostatic chuck. In various embodiments, the bias DC signal may pulsate. The bias DC generator 32*a* may be provided in addition to the RF power supply 31, and may be provided instead of the second RF generator 31*b*.

The antenna 14 includes one or more coils. In one embodiment, the antenna 14 may include an outer coil and an inner coil that are coaxially arranged. In this case, the RF power supply 31 may be connected to both the outer coil and the inner coil, or may be connected to either the outer coil or the inner coil. In the former case, the same RF generator may be connected to both the outer coil and the inner coil, or separate RF generators may be separately connected to the outer coil and the inner coil.

The exhaust system 40 may be connected to a gas outlet 10*e* disposed at a bottom portion of the plasma processing chamber 10, for example. The exhaust system 40 may include a pressure control valve and a vacuum pump. The pressure control valve adjusts a pressure in the plasma processing space 10*s*. The vacuum pump may include a turbo molecular pump, a dry pump, or a combination thereof.

The controller 2 processes computer-executable instructions that cause the plasma processing apparatus 1 to perform various steps described in the present disclosure. The controller 2 may be configured to control individual components of the plasma processing apparatus 1 to perform various steps described herein. In one embodiment, a part or all of the controller 2 may be included in the plasma processing apparatus 1. The controller 2 may include, e.g., a computer 2*a*. The computer 2*a* may include, e.g., a central processing unit (CPU) 2*a*1, a storage device 2*a*2, and a communication interface 2*a*3. The central processing unit 2*a*1 may be configured to perform various control operations based on a program stored in the storage device 2*a*2. The storage device 2*a*2 may include a random access memory (RAM), a read only memory (ROM), a hard disk drive (HDD), a solid state drive (SSD), or a combination thereof. The communication interface 2*a*3 may communicate with the plasma processing apparatus 1 through a communication line such as a local area network (LAN) or the like.

<Influence of Terrestrial Magnetism in Plasma Processing Apparatus>

Figure 2:
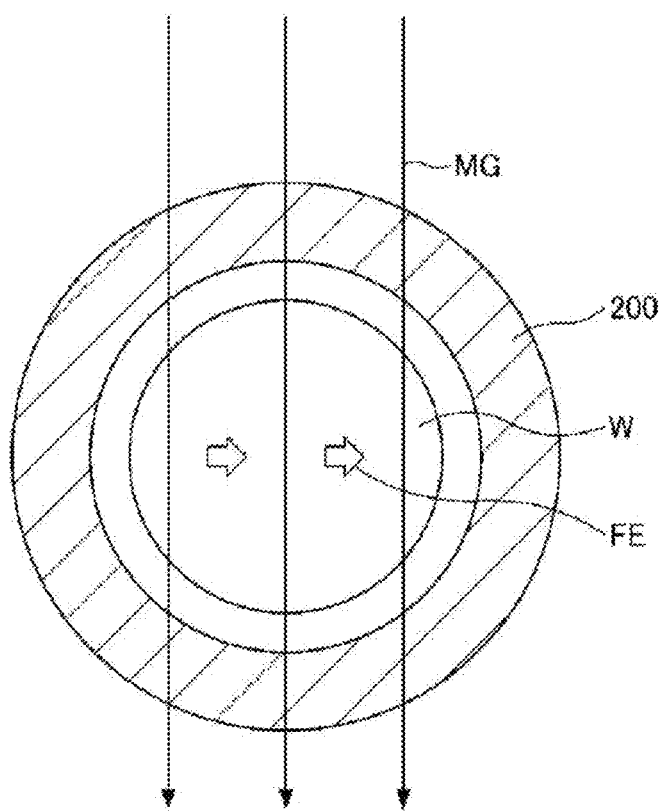
FIG. 2 explains the influence of terrestrial magnetism in a plasma processing apparatus.
Figure 3:
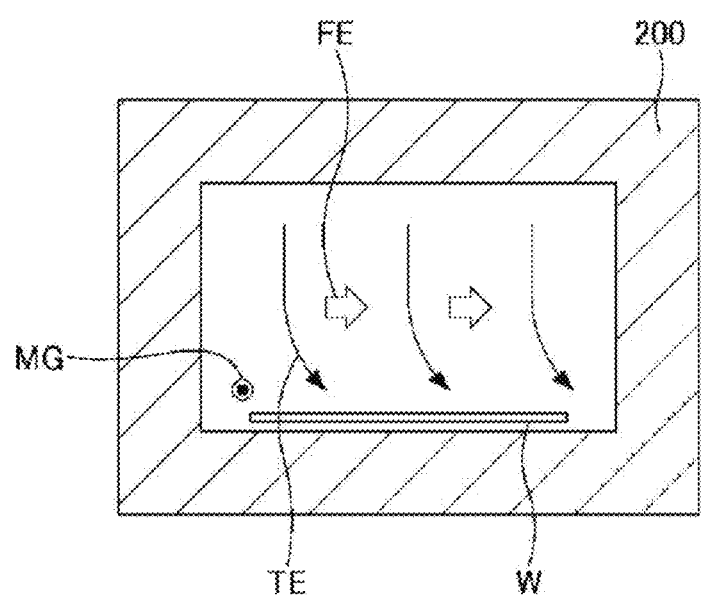
FIG. 3 explains the influence of terrestrial magnetism in the plasma processing apparatus.

First, the influence of an external magnetic field in the plasma processing apparatus 1 will be described. FIGS. 2 and 3 explain the influence of the external magnetic field in the plasma processing apparatus 1. The main component of the external magnetic field is terrestrial magnetism or a magnetic field transmitting the plasma processing apparatus 1 horizontally. Hereinafter, the external magnetic field will be described as the terrestrial magnetism. FIG. 2 is a cross-sectional view of the plasma processing apparatus 1 taken along a plane parallel to a horizontal plane. FIG. 3 is a cross-sectional view of the plasma processing apparatus 1 taken along the plane perpendicular to the horizontal plane.

In FIG. 2 and subsequent drawings, the plasma processing chamber 10 of the plasma processing apparatus 1 is schematically illustrated as a plasma processing chamber 200.

The plasma processing chamber 200 is made of, e.g., aluminum. Since aluminum is a non-magnetic material, the plasma processing chamber 200 itself cannot shield a magnetic flux. Therefore, terrestrial magnetism MG enters the plasma processing chamber 200.

For example, electrons in the plasma generate a force FE in a direction perpendicular to the terrestrial magnetism MG by the terrestrial magnetism MG that enters the plasma processing chamber 200. Therefore, as indicated by arrows TE, the electrons in the plasma are biased to one side of the plasma processing chamber 200, and the plasma density distribution is biased. Hence, the density distribution of ions generated by the plasma is also biased, so that the etching rate distribution is biased depending on locations in the plasma processing chamber 200.

The plasma processing apparatus according to the present embodiment suppresses the influence of terrestrial magnetism by providing a magnetic shield on a part of the outer side of the plasma processing chamber 200.

First Embodiment

The plasma processing apparatus 120 according to the first embodiment includes a magnetic shield 300 that covers an outer peripheral portion of the side surface of the plasma processing chamber 200 to satisfy a specific condition.

Figure 4:
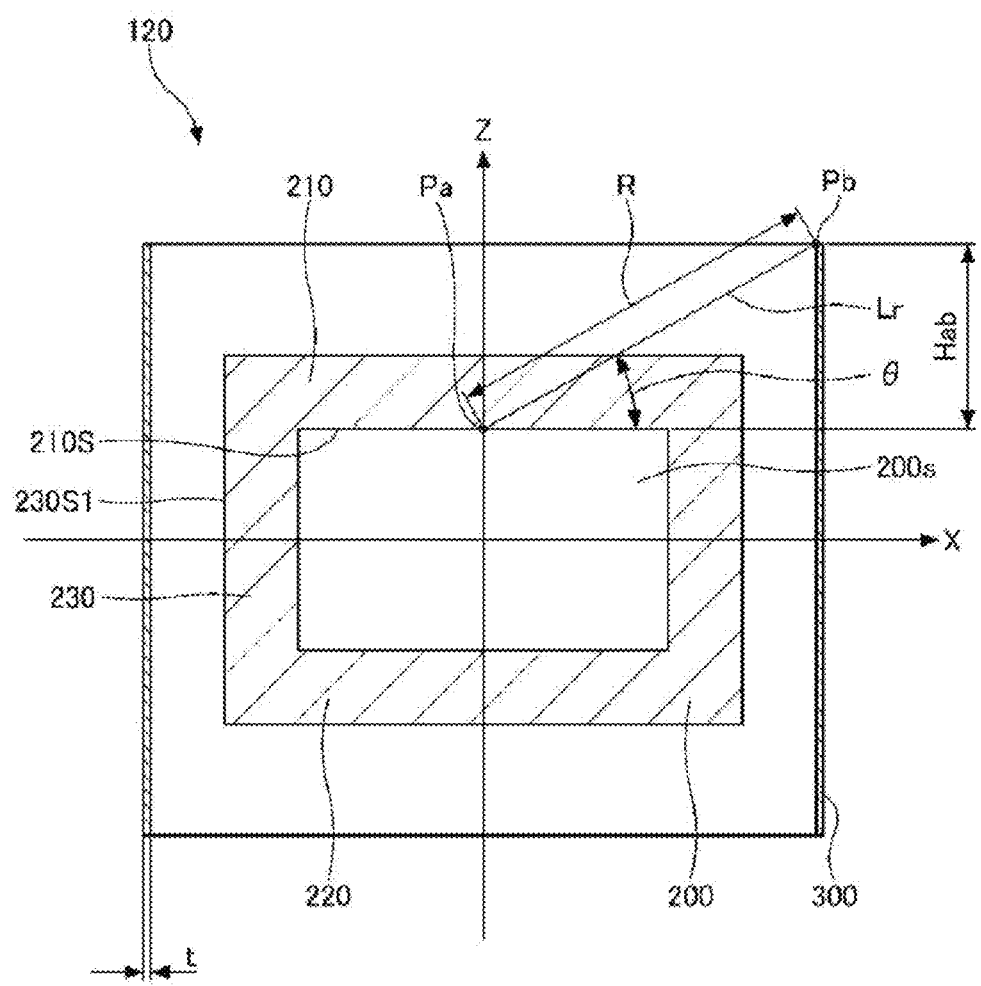
FIG. 4 is an exemplary cross-sectional view of the plasma processing apparatus according to a first embodiment.
Figure 5:
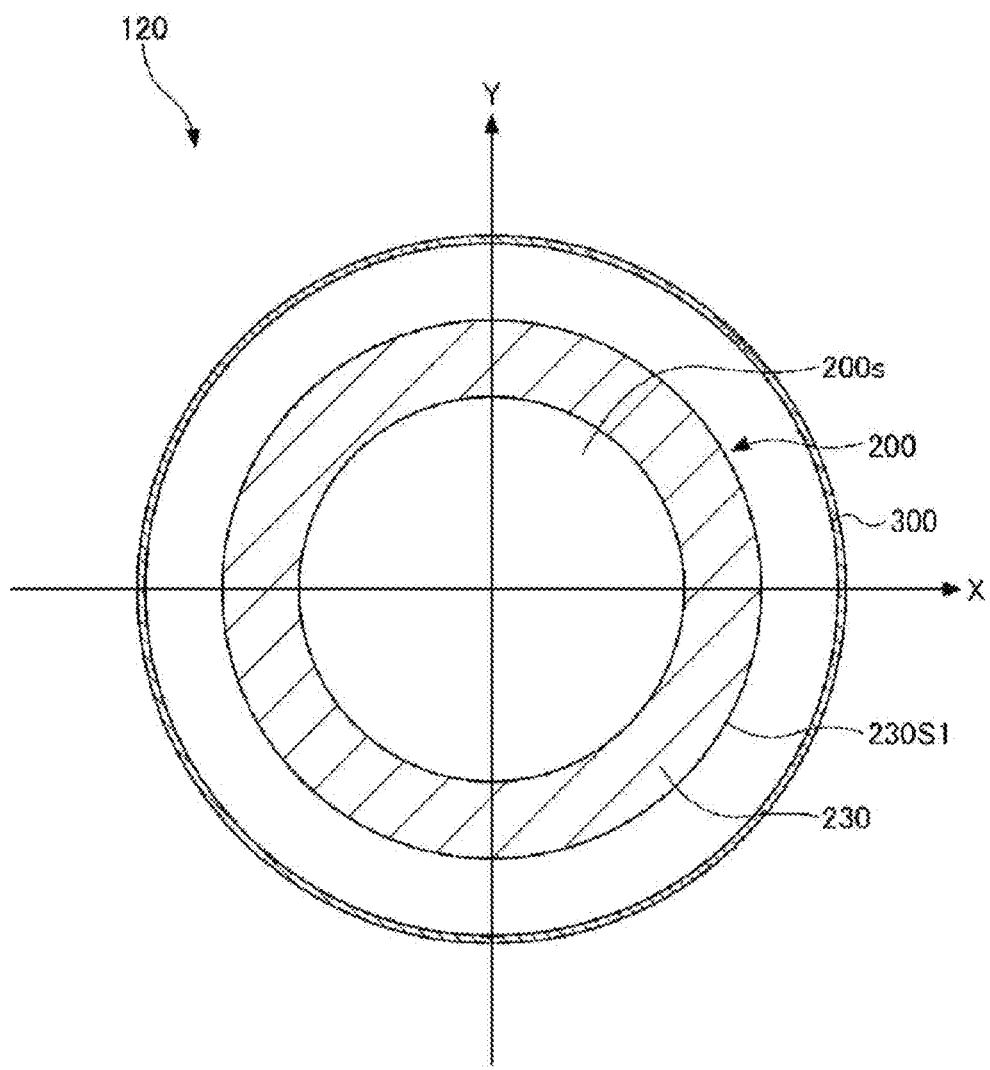
FIG. 5 is an exemplary cross-sectional view of the plasma processing apparatus according to the first embodiment.

FIG. 4 is a cross-sectional view seen from the side of the plasma processing apparatus 120 that is an example of the plasma processing apparatus according to the first embodiment. FIG. 5 is a cross-sectional view seen from the top of the plasma processing apparatus 120 that is an example of the plasma processing apparatus according to the first embodiment.

For convenience of description, a virtual 3D coordinate system (XYZ orthogonal coordinate system) including an X-axis, a Y-axis, and a Z-axis (XYZ-axes) that are orthogonal to one another may be set. However, the corresponding coordinate system is defined for description, and does not limit the posture of the plasma processing apparatus or the like.

In the present disclosure, unless otherwise specified, the X-axis direction and the Y-axis direction are perpendicular to each other and parallel to a placement surface of the plasma processing apparatus. The Z-axis is perpendicular to the X-axis and the Y-axis. The Z-axis direction may be referred to as "vertical direction." Further, a +Z side may be referred to as "upper side" and a −Z side may be referred to as "lower side" with respect to a target.

The plasma processing apparatus is placed horizontally. Therefore, the magnetic field of the terrestrial magnetism is parallel to the XY plane including the X-axis and the Y-axis.

The plasma processing apparatus 120 includes the plasma processing chamber 200 and the magnetic shield 300.

The plasma processing chamber 200 has a hollow columnar outer shape. The plasma processing chamber 200 has an upper wall 210, a lower wall 220, and a sidewall 230. Each of the upper wall 210 and the lower wall 220 has a disc shape. The sidewall 230 has a cylindrical shape.

The plasma processing chamber 200 is made of a non-magnetic material such as aluminum. Since the plasma processing chamber 200 is made of a non-magnetic material, the terrestrial magnetism enters the plasma processing chamber 200.

The inner space of the plasma processing chamber 200 serves as a plasma processing space 200s. The plasma processing space 200s has a cylindrical shape.

Therefore, the plasma processing apparatus 120 includes the magnetic shield 300 to remove the influence of the terrestrial magnetism in the plasma processing chamber 200. The magnetic shield 300 is made of a magnetic material such as Permalloy, electromagnetic stainless steel, iron, or the like.

The magnetic shield 300 has a cylindrical shape. The magnetic shield 300 is spaced apart from the periphery of the sidewall 230 of the plasma processing chamber 200. The magnetic shield 300 has an open top and an open bottom. In other words, the magnetic shield 300 is not disposed above and below the plasma processing chamber 200.

The magnetic shield 300 is disposed to surround the plasma processing space 200s of the plasma processing chamber 200. In other words, the magnetic shield 300 is disposed around the outer side of the sidewall 230. The terrestrial magnetism enters the plasma processing space 200s from the upper side of the magnetic shield 300. In the plasma processing space 200s, the influence of the terrestrial magnetism (magnetic field) is maximum at a midpoint Pa of an inner surface 210S of the upper wall 210 on the plasma processing space 200s side. This is also applied to the midpoint of the inner surface of the lower wall 220. Therefore, the influence of the terrestrial magnetism at the midpoint Pa was checked.

The influence of the terrestrial magnetism was evaluated by obtaining a magnetic flux density at the midpoint Pa by simulation. The influence of the terrestrial magnetism at the midpoint Pa is evaluated as a magnetic shield (MS) coefficient. The MS coefficient is a ratio of a magnetic flux density B2 at the midpoint Pa in the case where the magnetic shield 300 exists to a magnetic flux density B1 at the midpoint Pa in the case where the magnetic shield 300 does not exist. Specifically, the MS coefficient is expressed as 20 Log(B1/B2)[dB]. In other words, the MS coefficient increases when the magnetic shield 300 shields the terrestrial magnetism.

It is assumed that an initial relative permeability of the magnetic material forming the magnetic shield 300 is μi and a thickness of the magnetic shield 300 is t[m].

The MS coefficient of the magnetic shield is determined by a product Pmc[m] of the initial relative permeability μi of the magnetic material of the magnetic shield and the thickness t[m] of the magnetic shield. For example, in the case where the plasma processing chamber 200 is entirely covered with the magnetic shield, the MS coefficient of about 34 [dB] is obtained when the product Pmc[m] of the initial relative permeability and the thickness of the magnetic shield is 20. Further, in the case where the plasma processing chamber 200 is entirely covered with the magnetic shield, the MS coefficient of about 43 [dB] is obtained when the product Pmc[m] of the initial relative permeability and the thickness of the magnetic shield is 60.

Here, a distance from the midpoint Pa to an inner end point Pb of an upper end of the magnetic shield 300, i.e., the inner end point Pb of an upper opening 301U of the magnetic shield 300 is set to R[m]. Further, an angle formed by the inner surface 210S and a straight line Lr that connects the midpoint Pa and the end point Pb is set to θ[°].

The angle θ from the inner surface 210S toward the opposite side of the plasma processing space 200s is set to a positive angle, and the angle θ from the inner surface 210S toward the plasma processing space 200s side is set to a negative angle. In other words, in the case where the angle θ is positive, the magnetic shield 300 extends to the upper side of the plasma processing space 200s when viewed from a side. In the case where the angle θ is negative, there is a portion where the magnetic shield 300 does not cover the plasma processing space 200s when viewed from a side.

A distance from the inner surface 210S to the end point Pb is set to Hab[m]. The distance Hab is positive when the end point Pb is positioned above the inner surface 210S and negative when the end point Pb is positioned below the inner surface 210S.

In the simulation, a magnetic flux density B at the midpoint Pa was obtained under different conditions of the product Pmc of the initial relative permeability and the thickness of the magnetic shield, the distance R, and the angle θ. Then, the MS coefficient was calculated based on the obtained magnetic flux density B.

Specific simulation conditions will be described. A radius of an outer surface 230S1 of the sidewall 230 of the plasma processing chamber 200 was set to 270 [mm]. The radius of the inner side of the upper end of the magnetic shield 300 varies at an interval of 1 [mm] or 2 [mm] within a range of 280 [mm] to 470 [mm]. The distance Hab varies at an interval of 1 [mm] or 2 [mm] within a range of −5 [mm] to 50 [mm].

In the simulation, the MS coefficient was obtained at 341 points by combining the radius of the inner side of the upper end of the magnetic shield 300 and the distance Hab, i.e., the angle θ, in the case where the product Pmc of the initial relative permeability and the thickness of the magnetic shield was set to 20 [m], 30 [m], 40 [m], 60 [m], and 100 [m].

Figure 6:
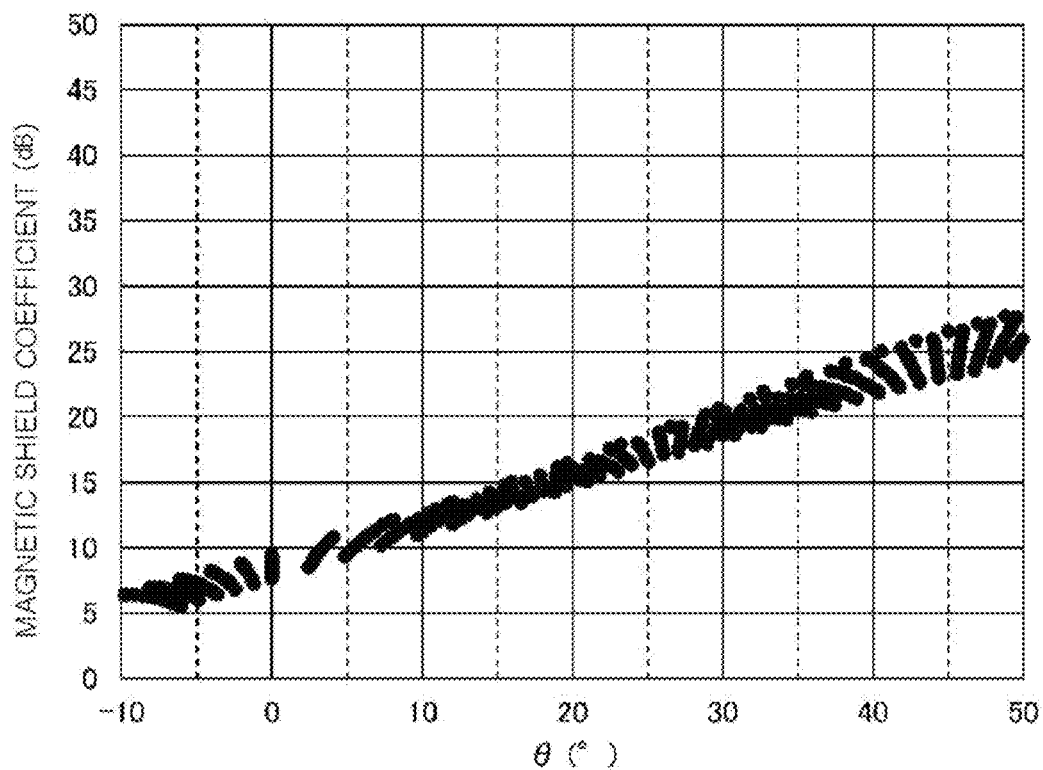
FIGS. 6 to 10 show exemplary evaluation results of the plasma processing apparatus according to the first embodiment.
Figure 7:
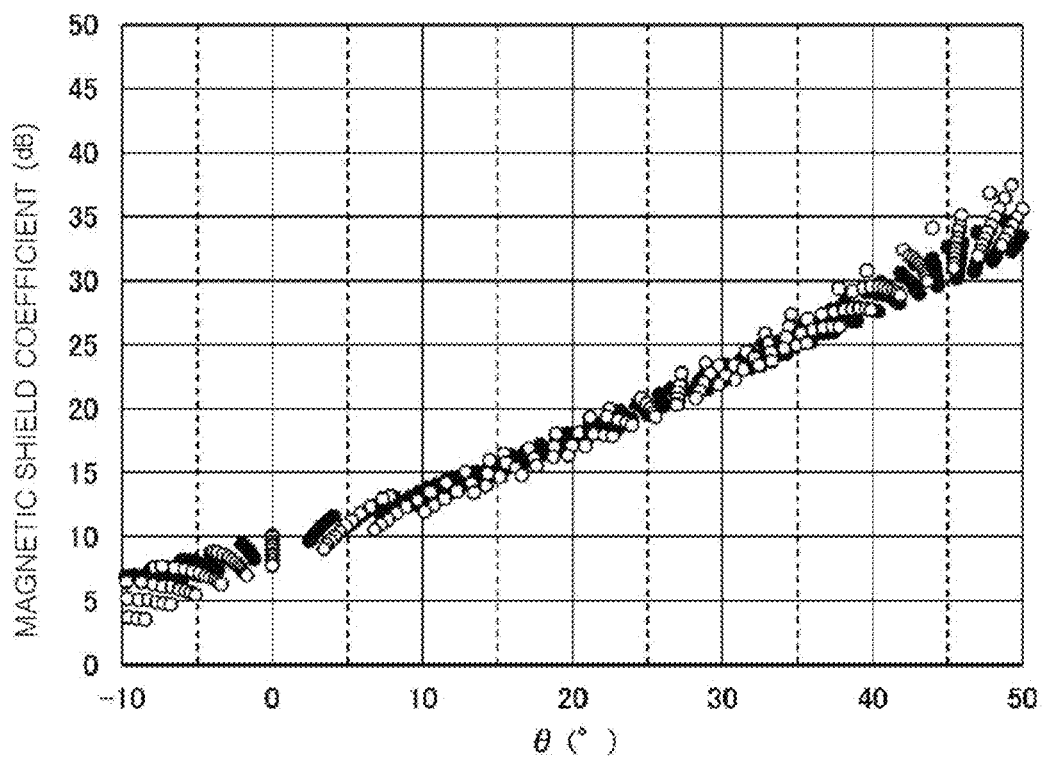
Figure 8:
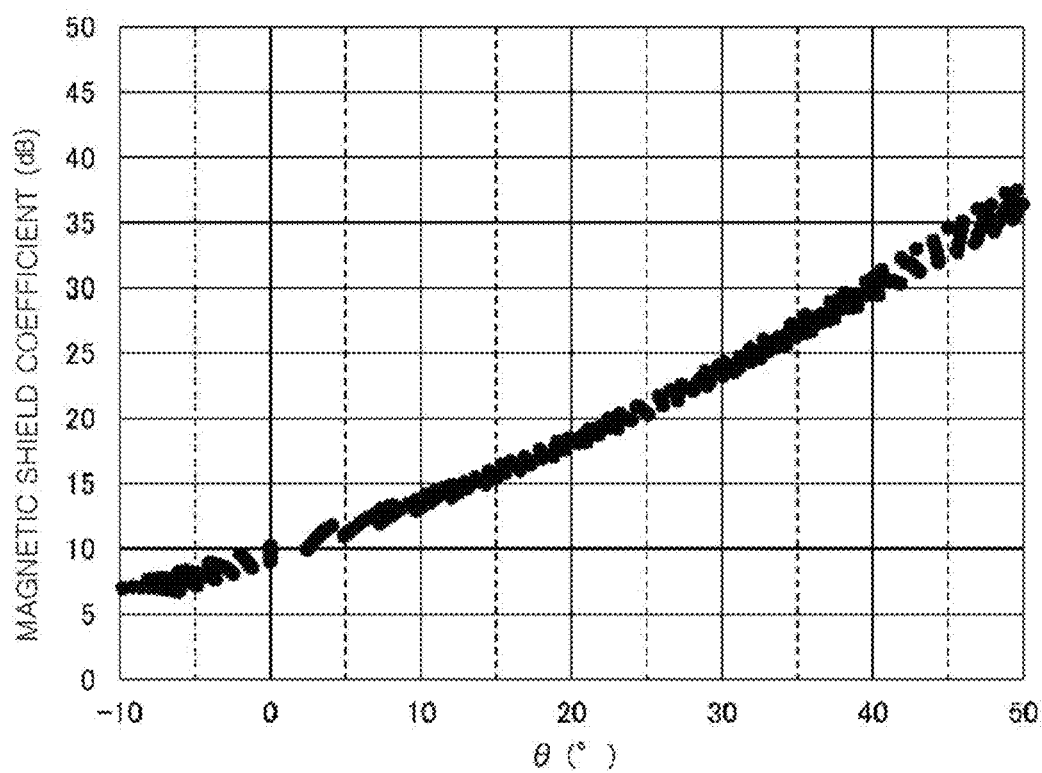

The simulation results are shown in FIGS. 6 to 8. The horizontal axes of FIGS. 6 to 8 represent the angle θ[°]. The vertical axis of FIGS. 6 to 8 represent the MS coefficient [dB].

FIG. 6 shows the result obtained when the product Pmc of the initial relative permeability and the thickness of the magnetic shield is 20 [m]. FIG. 7 shows the result obtained when the product Pmc of the initial relative permeability and the thickness of the magnetic shield is 60 [m]. FIG. 8 shows the result obtained when the product Pmc of the initial relative permeability and the thickness of the magnetic shield is 100 [m]. The graphs corresponding to the case where the products Pmc of the initial relative permeability and the thickness of the magnetic shield are 30 [m] and 40 [m] are omitted.

From the results of FIGS. 6 to 8, it can be determined that the MS coefficient is a function of the product Pmc of the initial relative permeability and the thickness of the magnetic shield and the angle θ without depending on the distance R.

Further, in the result obtained when the product Pmc of the initial relative permeability and the thickness of the magnetic shield in FIG. 7 is 60 [m], data obtained by reducing the size of the plasma processing chamber 200 to a half was also plotted to evaluate the influence of the size of the plasma processing chamber 200 in the simulation. White circle dots represent data obtained by reducing the size of the plasma processing chamber 200 to a half.

Referring to FIG. 7, the same result was obtained regardless of the size of the plasma processing chamber 200. In other words, similar results were obtained regardless of the size of the plasma processing chamber 200.

The measurement results obtained when the product Pmc of the initial relative permeability and the thickness of the magnetic shield was set to 20 [m], 30 [m], 40 [m], 60 [m], and 100 [m] were subjected to regression analysis using a quadratic polynomial in which the angle θ is used as an explanatory variable and the MS coefficient is used as an objective variable. Coefficients a, b and c of the following Eq. (1) were obtained by the regression analysis.

$$MS = a \times \theta^2 + b \times \theta + c \qquad \text{Eq. (1)}$$

The obtained coefficients are shown in Table 1.

TABLE 1

| Pmc | 20 | 30 | 40 | 60 | 100 |
|---|---|---|---|---|---|
| a | 0.00012 | 0.00071 | 0.00125 | 0.00215 | 0.00344 |
| b | 0.35025 | 0.36942 | 0.37661 | 0.37789 | 0.36693 |
| c | 8.61561 | 9.03211 | 9.24827 | 9.46287 | 9.62280 |

Figure 9:
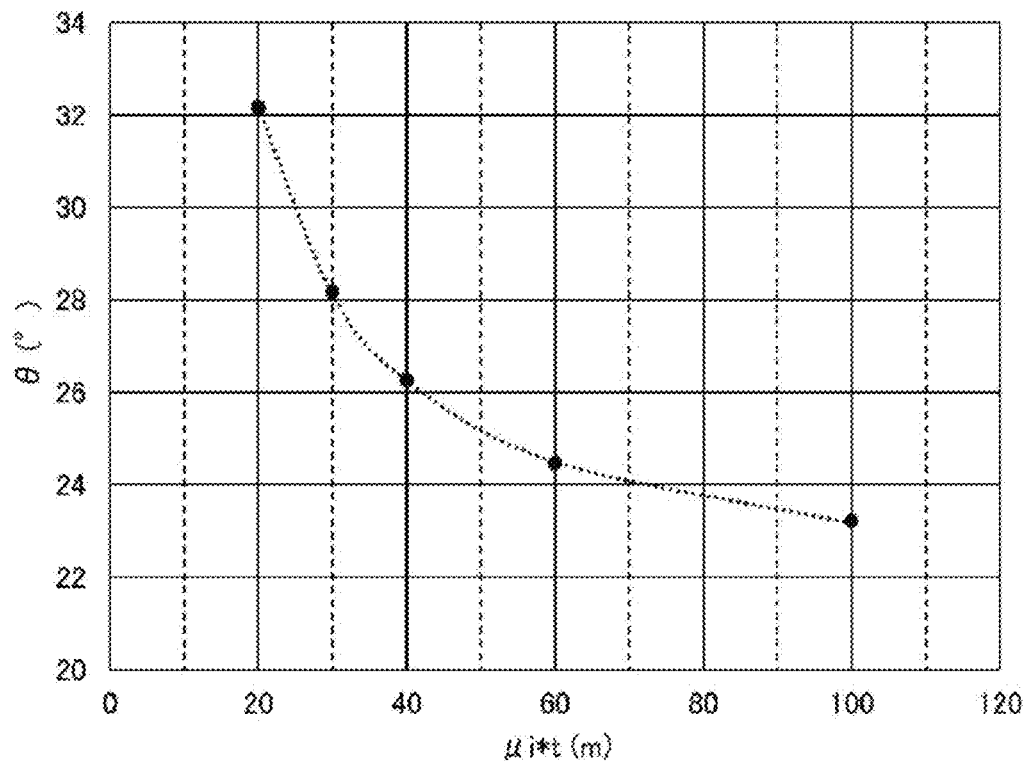

In the case where the product Pmc of the initial relative permeability and the thickness of the magnetic shield was set to 20 [m], 30 [m], 40 [m], 60 [m], and 100 [m], an angle θa at which the MS coefficient becomes 20 [dB] was obtained based on Eq. (1). The obtained results are shown in Table 2 and FIG. 9.

TABLE 2

| Pmc | 20 | 30 | 40 | 60 | 100 |
|---|---|---|---|---|---|
| θa | 32.161 | 28.169 | 26.261 | 24.472 | 23.221 |

The results in Table 2 were subjected to regression analysis using a quadratic polynomial in which the product Pmc of the initial relative permeability of the magnetic shield and the thickness is used as the explanatory variable and the angle θa[°] is used as the objective variable. The result thereof is shown in Eq. (2).

$$\theta a = 764 \times Pmc^{-2} + 179 \times Pmc^{-1} + 21.3 \qquad \text{Eq. (2)}$$

Therefore, the magnetic shield 300 is formed such that the angle θ[°] satisfies the following Eq. (3). Accordingly, the MS coefficient can be about 20 dB or more.

$$\theta > 764 \times Pmc^{-2} + 179 \times Pmc^{-1} + 21.3 \qquad \text{Eq. (3)}$$

In the case of using the magnetic shield 300 having the angle θ that satisfies Eq. (3), the MS coefficient is about 20 [dB]. When the MS coefficient is 20 [dB], an etching rate skew is about 0.5% to 1.2%. On the other hand, when the magnetic shield 300 does not exist, the etching rate skew is about 2.8% to 5.3%. Hence, the etching rate skew can be improved by setting the MS coefficient to about 20 [dB].

Figure 10:
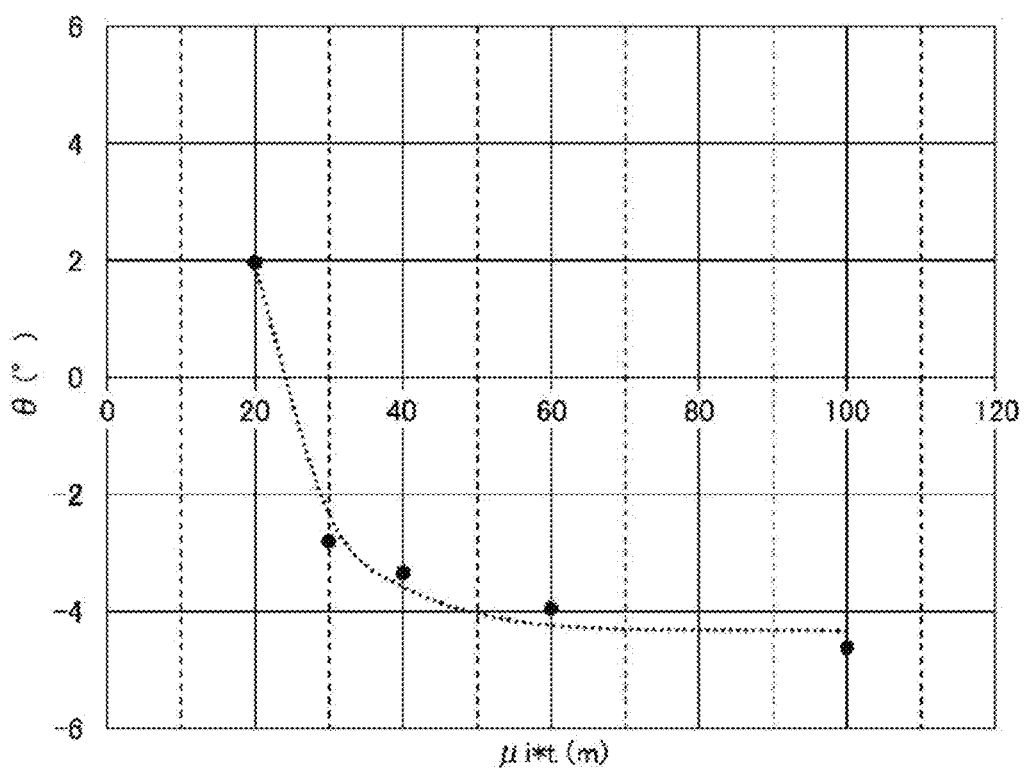

In the case where the product Pmc of the initial relative permeability and the thickness of the magnetic shield was set to 20 [m], 30 [m], 40 [m], 60 [m], and 100 [m], an angle θb at which the MS coefficient becomes 8 [dB] was obtained based on Eq. (1). The obtained results are shown in Table 3 and FIG. 10.

TABLE 3

| Pmc | 20 | 30 | 40 | 60 | 100 |
|---|---|---|---|---|---|
| θb | 1.9586 | −2.8090 | −3.3518 | −3.9605 | −4.6232 |

The results in Table 3 were subjected to regression analysis using a quadratic polynomial in which the product Pmc of the initial relative permeability of the magnetic shield and the thickness is used as the explanatory variable and the angle θb is used as the objective variable. The result thereof is shown in Eq. (4).

$$\theta b = 4200 \times Pmc^{-2} - 96 \times Pmc^{-1} - 3.8 \quad \text{Eq. (4)}$$

Therefore, the magnetic shield 300 is formed such that the angle θ[°] satisfies the following Eq. (5). Accordingly, the MS coefficient can be about 8 dB or more.

$$\theta > 4200 \times Pmc^{-2} - 96 \times Pmc^{-1} - 3.8 \quad \text{Eq. (5)}$$

<Modification 1>

Figure 11:
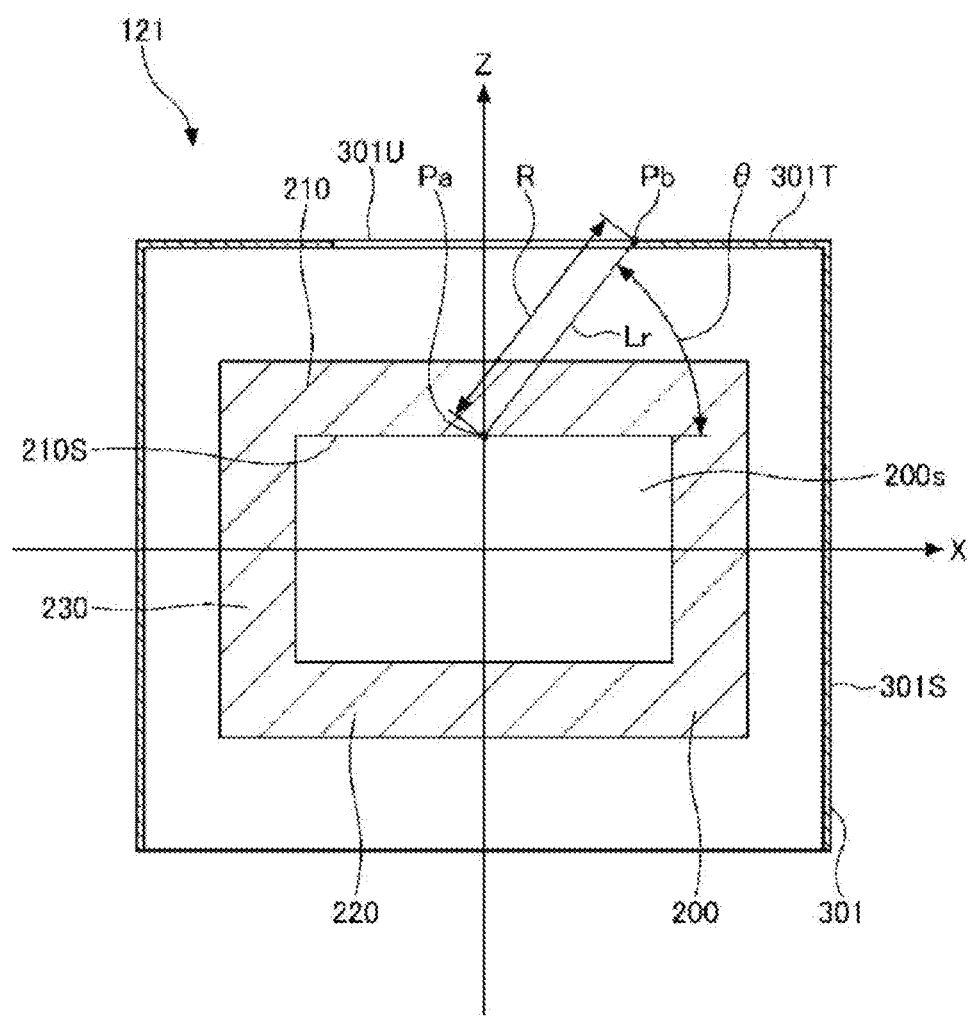
FIGS. 11 to 15 are exemplary cross-sectional views of modifications of the plasma processing apparatus according to the first embodiment.

A plasma processing apparatus 121 that is a modification of the plasma processing apparatus 120 according to the first embodiment will be described. FIG. 11 is a cross-sectional view seen from the side of the plasma processing apparatus 121 that is an example of the modification of the plasma processing apparatus according to the first embodiment.

The plasma processing apparatus 121 includes a magnetic shield 301 instead of the magnetic shield 300 of the plasma processing apparatus 120.

The magnetic shield 301 has a tubular portion 301S and an upper surface portion 301T. The tubular portion 301S is disposed in parallel to the outer surface 230S1 of the plasma processing chamber 200. The tubular portion 301S has a tubular shape.

The upper surface portion 301T covers an upper side of the tubular portion 301S. The upper surface portion 301T has an opening 301U at the center thereof.

In the plasma processing apparatus 121, the angle θ is defined by the straight line Lr that connects the midpoint Pa and the inner end point Pb of the opening 301U. Then, the angle θ is determined to satisfy Eq. (3) or (5).

<Modification 2>

Figure 12:
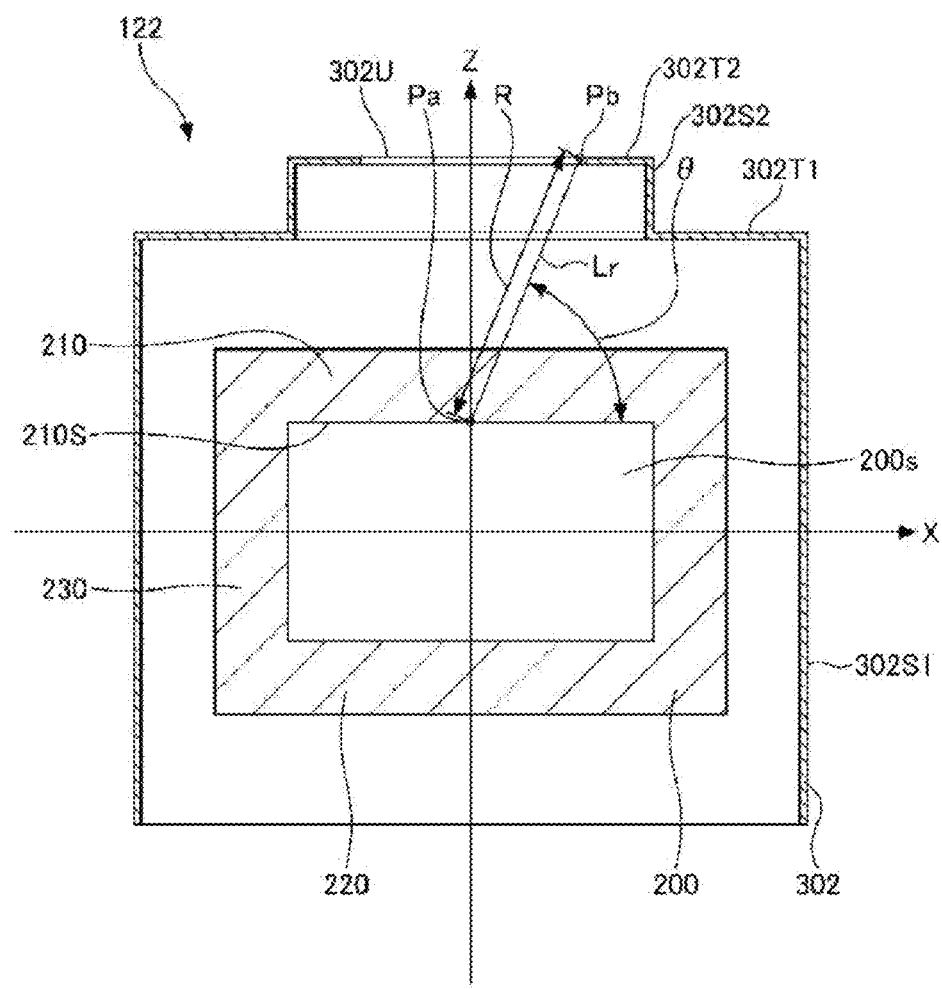

A plasma processing apparatus 122 that is a modification of the plasma processing apparatus 120 according to the first embodiment will be described. FIG. 12 is a cross-sectional view seen from the side of the plasma processing apparatus 122 that is an example of the modification of the plasma processing apparatus according to the first embodiment.

The plasma processing apparatus 122 includes a magnetic shield 302 instead of the magnetic shield 300 of the plasma processing apparatus 120.

The magnetic shield 302 has a tubular portion 302S1, an upper surface portion 302T1, a tubular portion 302S2, and an upper surface portion 302T2. The tubular portion 302S1 is disposed in parallel to the outer surface 230S1 of the plasma processing chamber 200. The tubular portion 302S1 has a tubular shape.

The upper surface portion 302T1 covers the upper side of the tubular portion 302S1. The tubular portion 302S2 parallel to the outer surface 230S1 of the plasma processing chamber 200 is disposed on the upper surface portion 302T1. The upper surface portion 302T2 is disposed on the tubular portion 302S2. The opening 302U is formed at the upper surface portion 302T2.

As described above, the magnetic shield 302 of the plasma processing apparatus 122 has a stepped portion at an upper part thereof.

In the plasma processing apparatus 122, the angle θ is defined by the straight line Lr that connects the midpoint Pa and the inner end point Pb of the opening 302U. Then, the angle θ is determined to satisfy Eq. (3) or (5).

<Modification 3>

Figure 13:
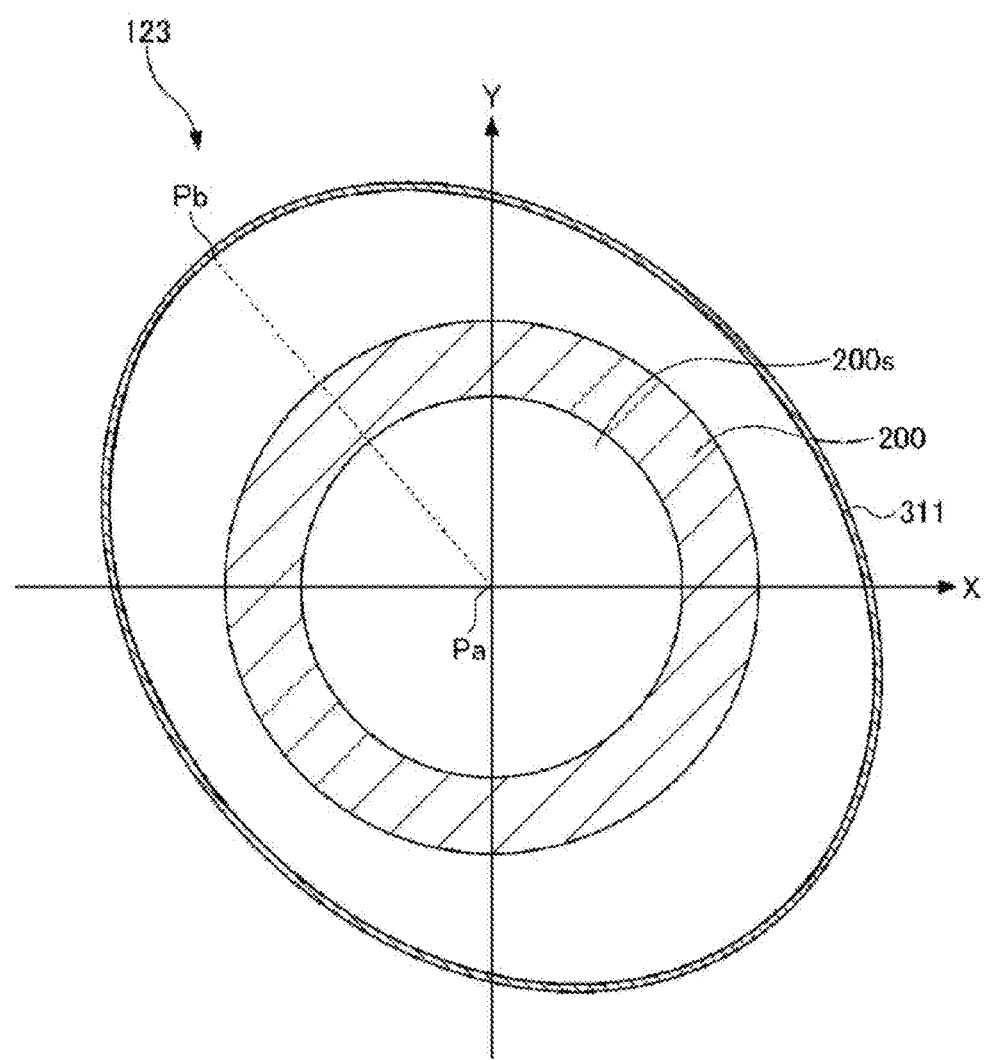
Figure 14:
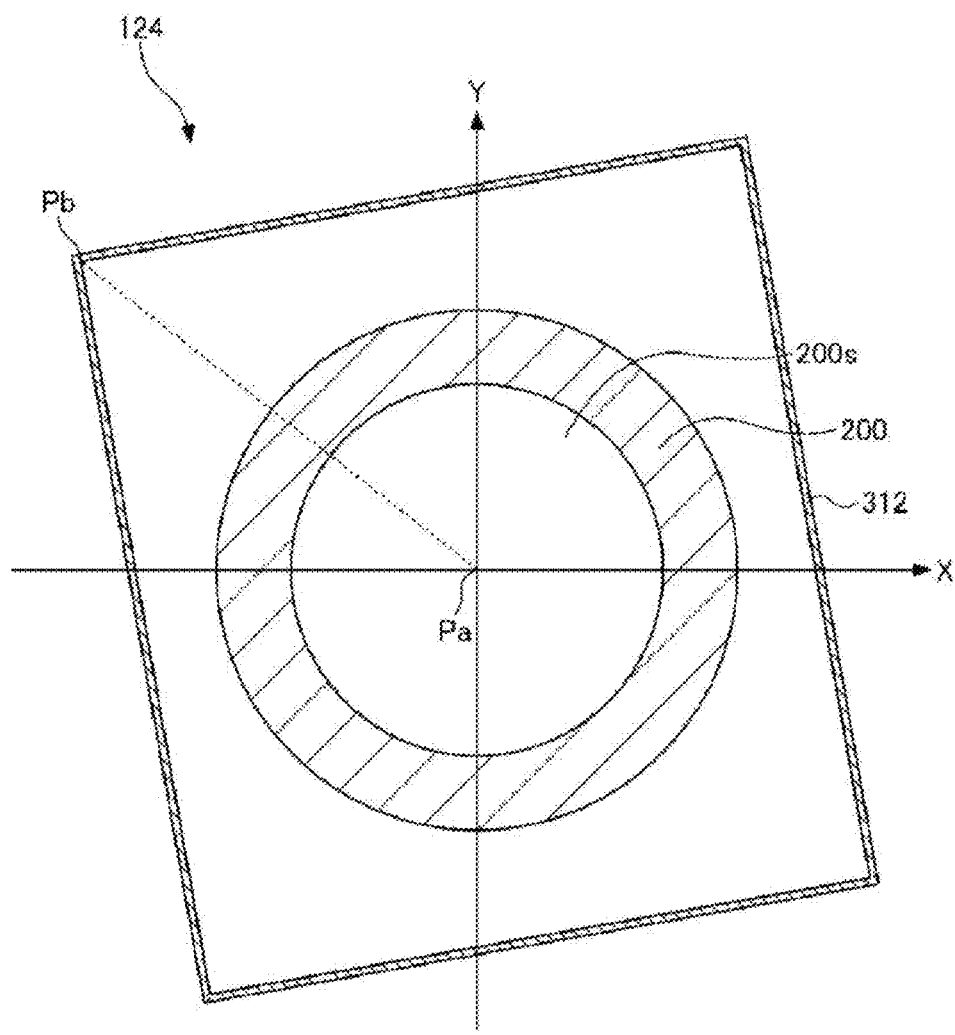
Figure 15:
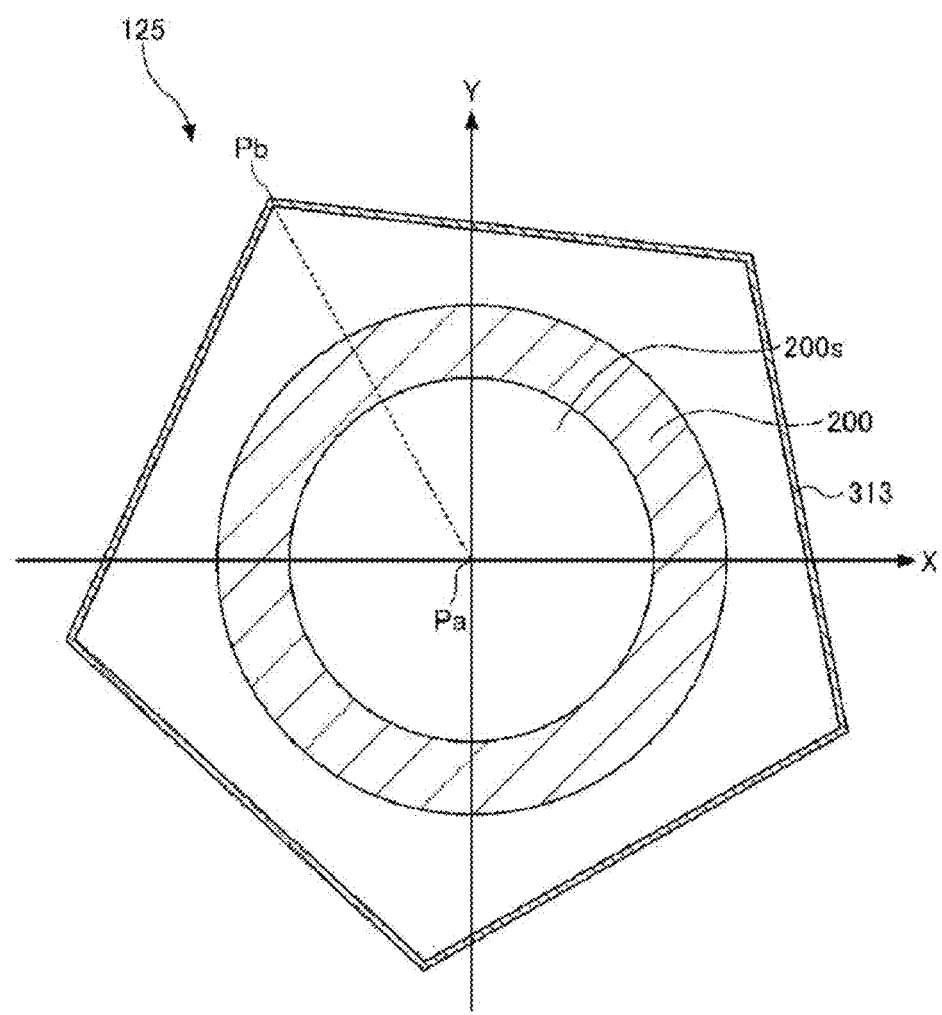

Next, plasma processing apparatuses 123, 124, and 125 that are the modifications of the plasma processing apparatus 120 according to the first embodiment will be described. FIGS. 13 to 15 are respective cross-sectional views seen from the top of the plasma processing apparatuses 123 to 125 that are exemplary modifications of the plasma processing apparatus according to the first embodiment.

In the magnetic shield 300 of the plasma processing apparatus 120, an opening has the same radius with respect to the midpoint Pa, i.e., with respect to the Z-axis. However, the magnetic shield does not necessarily have a shape in which the opening has the same radius with respect to the midpoint Pa, i.e., with respect to the Z-axis.

The plasma processing apparatus 123 includes a tubular magnetic shield 311 (see FIG. 13) having an elliptical shape when viewed from the top, instead of the magnetic shield 300 of the plasma processing apparatus 120. The plasma processing apparatus 124 includes a cylindrical magnetic shield 312 (see FIG. 14) having a rectangular shape when viewed from the top, instead of the magnetic shield 300 of the plasma processing apparatus 120. The plasma processing apparatus 125 includes a cylindrical magnetic shield 313 (see FIG. 15) having a pentagonal shape when viewed from the top, instead of the magnetic shield 300 of the plasma processing apparatus 120.

The influence of the magnetic shield on the midpoint Pa is maximum at the location where the angle θ is smallest. For example, if the magnetic shield has difference distances with respect to the midpoint Pa when viewed from the top and the height of the magnetic shield is constant regardless of the location, the angle θ is smallest at the point farthest from the midpoint Pa. The influence of the terrestrial magnetism on the shielding performance at the midpoint Pa is large at the location where the angle θ is smallest. Therefore, when the magnetic shield has a shape in which the opening has different radii with respect to the midpoint Pa, the angle θ is determined such that the angle θ at the end point Pb farthest from the midpoint Pa satisfies Eq. (3) or (5).

Second Embodiment

A plasma processing apparatus 126 according to a second embodiment includes magnetic shields 400 and 410 that cover an outer peripheral side of the side surface of the plasma processing chamber 200 to satisfy specific conditions. The magnetic shields 400 and 410 are disposed on the side surface of the plasma processing chamber 200 to be spaced apart from each other. In other words, the plasma processing apparatus 126 includes a magnetic shield having a slit on the side of the plasma processing space 200s.

Figure 16:
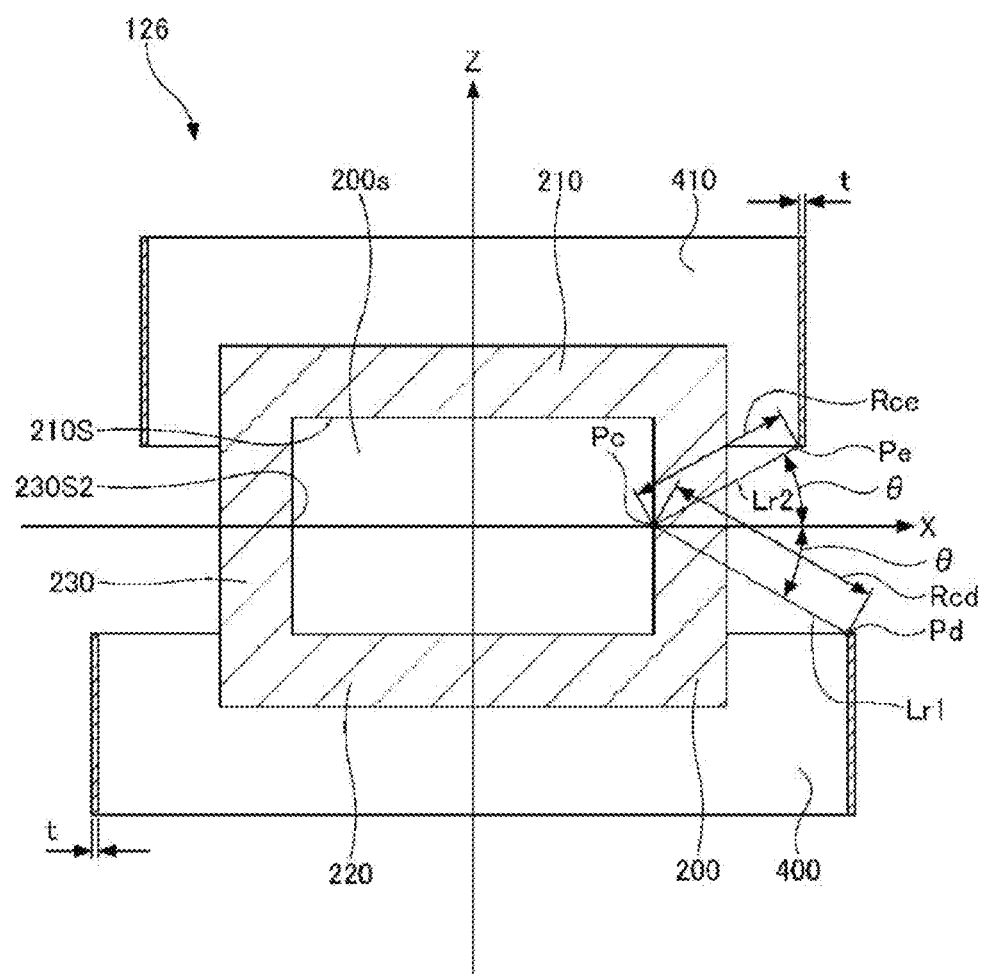
FIG. 16 is an exemplary cross-sectional view of a plasma processing apparatus according to a second embodiment.

FIG. 16 is a cross-sectional view seen from the side of the plasma processing apparatus 126 that is an example of the plasma processing apparatus according to the second embodiment.

The plasma processing apparatus 126 includes the plasma processing chamber 200, and the magnetic shields 400 and 410. The plasma processing apparatus 126 includes the magnetic shields 400 and 410 to remove the influence of the terrestrial magnetism in the plasma processing chamber 200. The magnetic shields 400 and 410 are made of a magnetic material, e.g., Permalloy, electromagnetic stainless steel, iron, or the like.

Each of the magnetic shields 400 and 410 has a cylindrical shape having a thickness t. The magnetic shield 410 is spaced apart from the magnetic shield 400. Further, the magnetic shield 400 has a larger radius with respect to the Z-axis compared to the magnetic shield 410.

The magnetic shields 400 and 410 are spaced apart from each other. Therefore, the side surface of the plasma processing chamber 200 has a portion where both the magnetic shields 400 and 410 are not disposed. The vertical widths of the magnetic shields 400 and 410 are sufficiently large so that the terrestrial magnetism does not enter the plasma processing chamber 200.

The magnetic shields 400 and 410 are disposed to surround the plasma processing space 200s of the plasma processing chamber 200. The terrestrial magnetism enters the plasma processing space 200s from the gap between the magnetic shield 400 and the magnetic shield 410. In the plasma processing space 200s, a midpoint Pc of the inner side surface 230S2 of the sidewall 230 is affected by the entering terrestrial magnetism (magnetic field). Therefore, the influence of the terrestrial magnetism at the midpoint Pc was checked.

The influence of the terrestrial magnetism was evaluated by simulation. The influence of the terrestrial magnetism at the midpoint Pc is evaluated as the MS coefficient. The MS coefficient is the ratio of the magnetic flux density B2 at the midpoint Pc in the case where the magnetic shields 400 and 410 exist to the magnetic flux density B1 at the midpoint Pc in the case where the magnetic shield 300 does not exist. Specifically, the MS coefficient is expressed as 20 Log(B1/B2) [dB]. In other words, a larger value indicates a larger MS coefficient.

It is assumed that the initial relative permeability $\mu i$ of the magnetic material forming the magnetic shields 400 and 410 is $\mu i$, and the thickness of each of the magnetic shields 400 and 410 is t[m].

Here, the distance from the midpoint Pc to an inner end point Pd of the upper end of the magnetic shield 400 is set to Rcd[m]. The distance from the midpoint Pc to an inner end point Pe of the lower end of the magnetic shield 410 is set to Rce[m]. Further, the angle formed by the surface parallel to the inner surface 210S passing through the midpoint Pc and a straight line Lr1 that connects the midpoint Pc and the end point Pd is equal to the angle formed by the surface parallel to the inner surface 210S passing through the midpoint Pc and a straight line Lr2 that connects the midpoint Pc and the end point Pe. Such an angle is set to $\theta[°]$.

Further, the ratio of the distance Rcd to the distance Rce, i.e., Rcd/Rce, was set to a ratio p.

In the simulation, the magnetic flux density B at the midpoint Pc was obtained under different conditions of the product Pmc, the ratio p, the distance R, and the angle $\theta$ of the initial relative permeability and the thickness of the magnetic shield. Then, the MS coefficient was calculated based on the obtained magnetic flux density B.

Specific simulation conditions will be described. The radius of the outer surface 230S1 of the sidewall 230 of the plasma processing chamber 200 was set to 270 [mm]. The distance Rce of the magnetic shield 410 was changed under three conditions, i.e., 10 [mm], 20 [mm], and 100 [mm]. The ratio p was changed under three conditions, i.e., 1, 1.5, and 2. The angle $\theta$ was changed at an interval of 5[°] within a range of 10[°] to 80[°].

In the simulation, the MS coefficient was calculated at 44 points by combining the distance Rce, the angle $\theta$, and the ratio p in the case where the product Pmc of the initial relative permeability and the thickness of the magnetic shield was set to 20 [m], 60 [m], and 100 [m].

Figure 17:
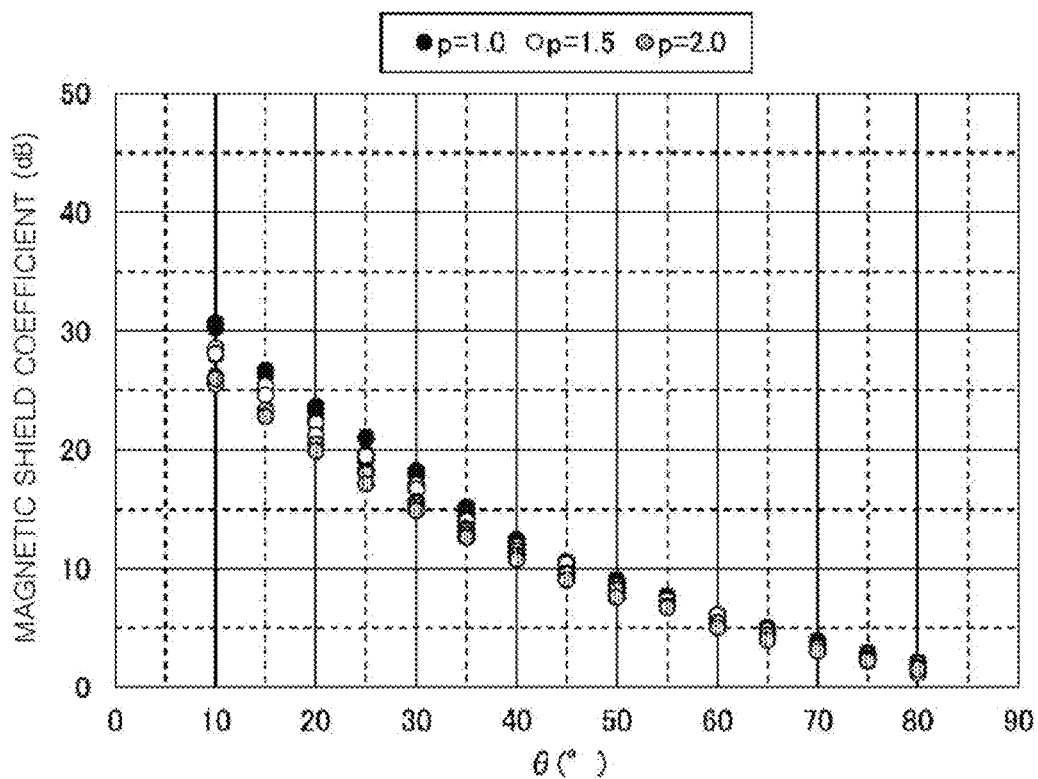
FIGS. 17 to 21 show exemplary evaluation results of the plasma processing apparatus according to the second embodiment.
Figure 18:
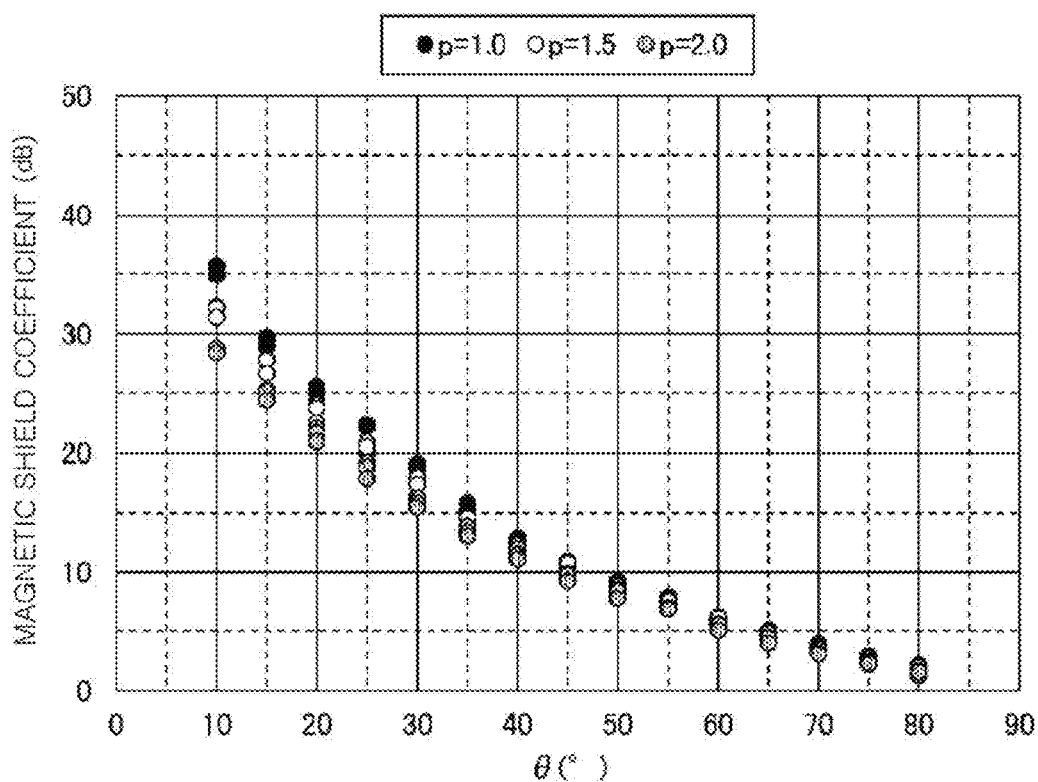
Figure 19:
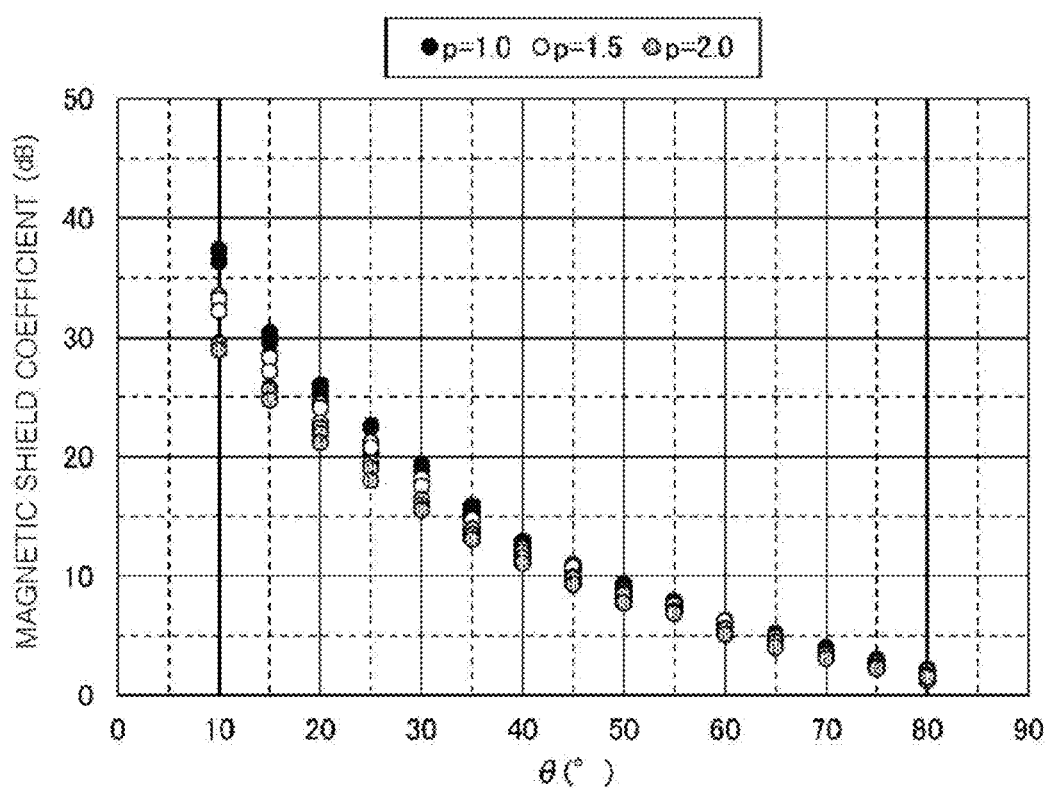

The simulation results are shown in FIGS. 17 to 19. The horizontal axes of FIGS. 17 to 19 represent the angle $\theta[°]$. The vertical axes of FIGS. 17 to 19 represent the MS coefficient [dB].

FIG. 17 shows the result obtained when the product Pmc of the initial relative permeability and the thickness of the magnetic shield was 20 [m]. FIG. 18 shows the result obtained when the product Pmc of the initial relative permeability and the thickness of the magnetic shield was 60 [m]. FIG. 19 shows the result obtained when the product Pmc of the initial relative permeability and the thickness of the magnetic shield was 100 [m].

From the results of FIGS. 17 to 19, it can be determined that the MS coefficient is a function of the product Pmc of the initial relative permeability and the thickness of the magnetic shield, the ratio p, and the angle $\theta$ without depending on the distances Rcd and Rce.

The measurement results obtained when the product Pmc of the initial relative permeability and the thickness of the magnetic shield was set to 20 [m], 60 [m], and 100 [m] were subjected to the regression analysis using a quadratic polynomial in which the MS coefficient is used as the objective variable and the angle $\theta$ is used as the explanatory variable while setting the ratio p to 1, 1.5 and 2. Coefficient d, e, f and g of the following Eq. (6) were obtained by the regression analysis.

$$MS = d \times \theta^{-1} + e \times \theta^2 + f \times \theta + g \qquad \text{Eq. (6)}$$

The obtained coefficients are shown in Tables 4 and 5.

TABLE 4

| | Pmc | | | | | |
|---|---|---|---|---|---|---|
| | 20 | | | 60 | | |
| | p | | | | | |
| | 1 | 1.5 | 2 | 1 | 1.5 | 2 |
| d | $-2.52 \times 10^{-5}$ | $-2.39 \times 10^{-5}$ | $-1.98 \times 10^{-5}$ | $-7.56 \times 10^{-5}$ | $-5.71 \times 10^{-5}$ | $-4.10 \times 10^{-5}$ |
| e | 0.00804 | 0.00730 | 0.00616 | 0.01657 | 0.01304 | 0.00991 |
| f | $-0.94608$ | $-0.86135$ | $-0.76097$ | $-1.41286$ | $-1.18734$ | $-0.98140$ |
| g | 39.12125 | 36.27582 | 33.04504 | 47.56384 | 42.51523 | 37.50128 |

TABLE 5

| Pmc | 100 | | |
|---|---|---|---|
| p | 1 | 1.5 | 2 |
| d | $-9.28 \times 10^{-5}$ | $-6.74 \times 10^{-5}$ | $-4.70 \times 10^{-5}$ |
| e | 0.01940 | 0.01478 | 0.01096 |
| f | $-1.56151$ | $-1.28281$ | $-1.04098$ |
| g | 50.08378 | 44.23621 | 38.64438 |

Figure 20:
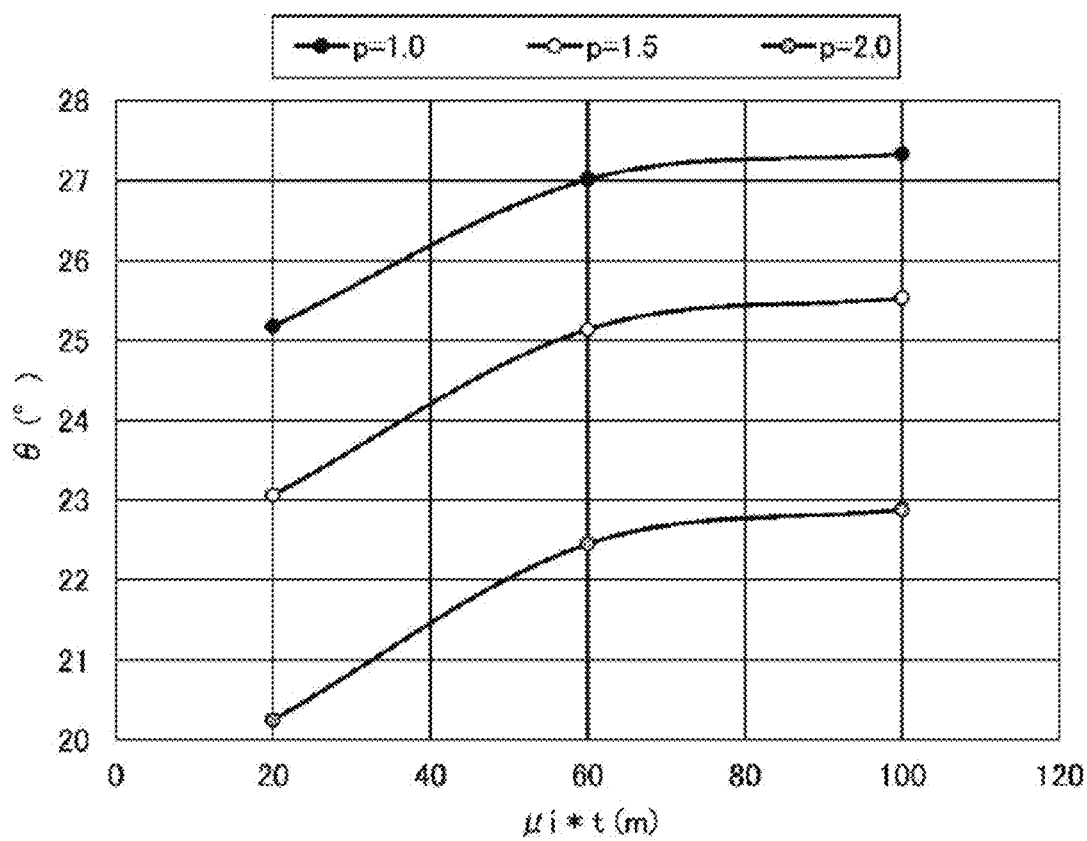

An angle θc at which the MS coefficient becomes 20 [dB] was obtained based on Eq. (6) in the case where the product Pmc of the initial relative permeability and the thickness of the magnetic shield were set to 20 [m], 60 [m], and 100 [m], and the ratio p was set to 1, 1.5 and 2. The obtained results are shown in Table 6 and FIG. 20.

TABLE 6

| | | θc | | |
|---|---|---|---|---|
| | | Pmc | | |
| | | 20 | 60 | 100 |
| p | 1 | 25.2 | 27.0 | 27.3 |
| | 1.5 | 23.1 | 25.1 | 25.5 |
| | 2 | 20.2 | 22.4 | 22.9 |

The results in Table b were subjected to the regression analysis using a quadratic polynomial in which the product Pmc of the initial relative permeability and thickness of the magnetic shield and the ratio p are used the explanatory variables and the angle θc is used as the objective variable. The result thereof is shown in Eq. (7).

$$\theta c = 25.4 - 0.265 \times p + 8.35 \times 10^{-2} \times Pmc + (-1.58) \times p^2 + 5.87 \times 10^{-3} \times p \times Pmc + (-5.17) \times 10^{-4} \times Pmc^2 \quad \text{Eq. (7)}$$

Therefore, the magnetic shields 400 and 410 are formed such that the angle θ[°] satisfies the following Eq. (8). Accordingly, the MS coefficient can be about 20 dB or more.

$$\theta < 25.4 - 0.265 \times p + 8.35 \times 10^{-2} \times Pmc + (-1.58) \times p^2 + 5.87 \times 10^{-3} \times p \times Pmc + (-5.17) \times 10^{-4} \times Pmc^2 \quad \text{Eq. (8)}$$

Figure 21:
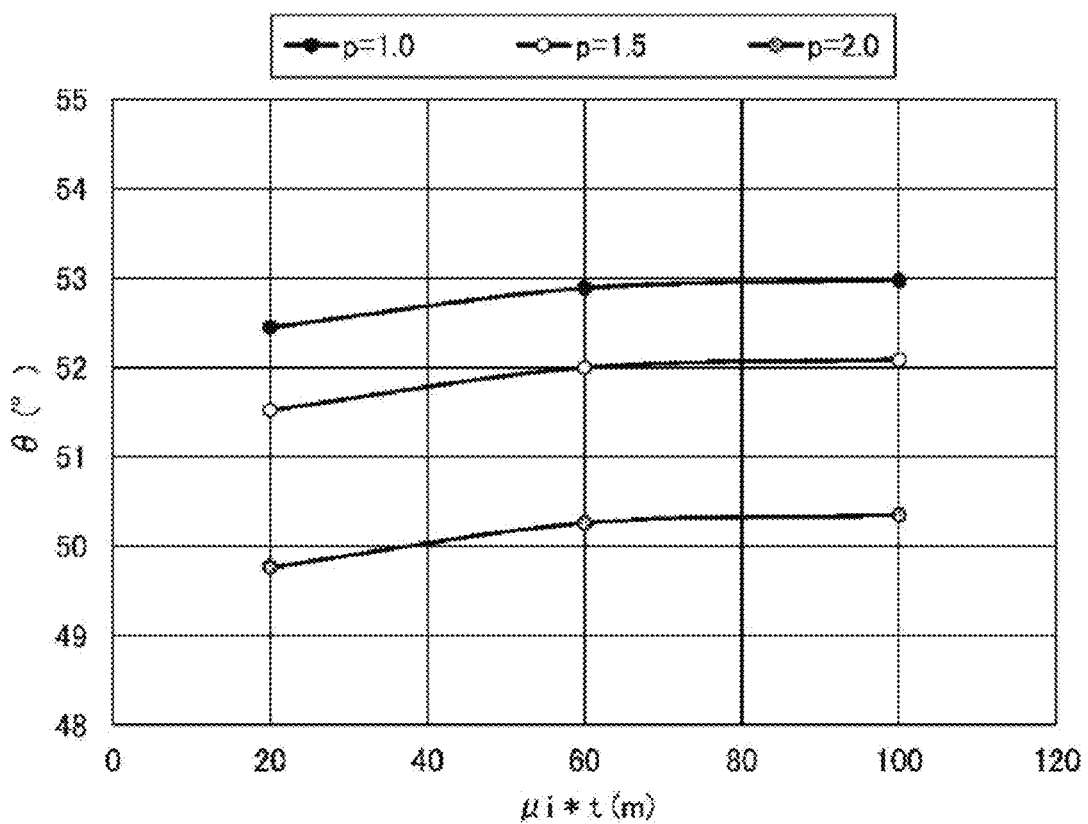

An angle θd at which the MS coefficient becomes 8 [dB] was obtained based on Eq. (6) in the case where the product Pmc of the initial relative permeability and the thickness of the magnetic shield was set to 20 [m], 60 [m], and 100 [m] and the ratio p was set to 1, 1.5 and 2. The obtained results are shown in Table 7 and FIG. 21.

TABLE 7

| | | θd | | |
|---|---|---|---|---|
| | | Pmc | | |
| | | 20 | 60 | 100 |
| p | 1 | 52.4 | 52.9 | 53.0 |
| | 1.5 | 51.5 | 52.0 | 52.1 |
| | 2 | 49.8 | 50.3 | 50.3 |

The results in Table 7 were subjected to the regression analysis using a quadratic polynomial in which the product Pmc of the initial relative permeability and thickness of the magnetic shield and the ratio p are used as the explanatory variables and the angle θd is used as the objective variable. The result thereof is shown in Eq. (9).

$$\theta d = 53.2 - 0.208 \times p + 1.87 \times 10^{-2} \times Pmc + (-0.855) \times p^2 + 1.75 \times 10^{-3} \times p \times Pmc + (-1.19) \times 10^{-4} \times Pmc^2 d \quad \text{Eq. (9)}$$

Therefore, the magnetic shields 400 and 410 are formed such that the angle θ[°] satisfies the following Eq. (10). Accordingly, the MS coefficient can be about 8 dB or more.

$$\theta < 53.2 - 0.208 \times p + 1.87 \times 10^{-2} \times Pmc + (-0.855) \times p^2 + 1.75 \times 10^{-3} \times p \times Pmc + (-1.19) \times 10^{-4} \times Pmc^2 \quad \text{Eq. (10)}$$

The magnetic shield 400 is an example of a first magnetic shield, and the magnetic shield 410 is an example of a second magnetic shield. The straight line Lr1 is an example of a first line, and the straight line Lr2 is an example of a second line.

The plasma processing apparatus 126 uses two magnetic shields, i.e., the magnetic shields 400 and 410. However, the number of magnetic shields is not limited to two, and may be three or more. In other words, the magnetic shield may have two or more slits.

Third Embodiment

A plasma processing apparatus according to the third embodiment, which has a combination of the magnetic shield of the plasma processing apparatus according to the first embodiment and the magnetic shield of the plasma processing apparatus according to the second embodiment, will be described.

Figure 22:
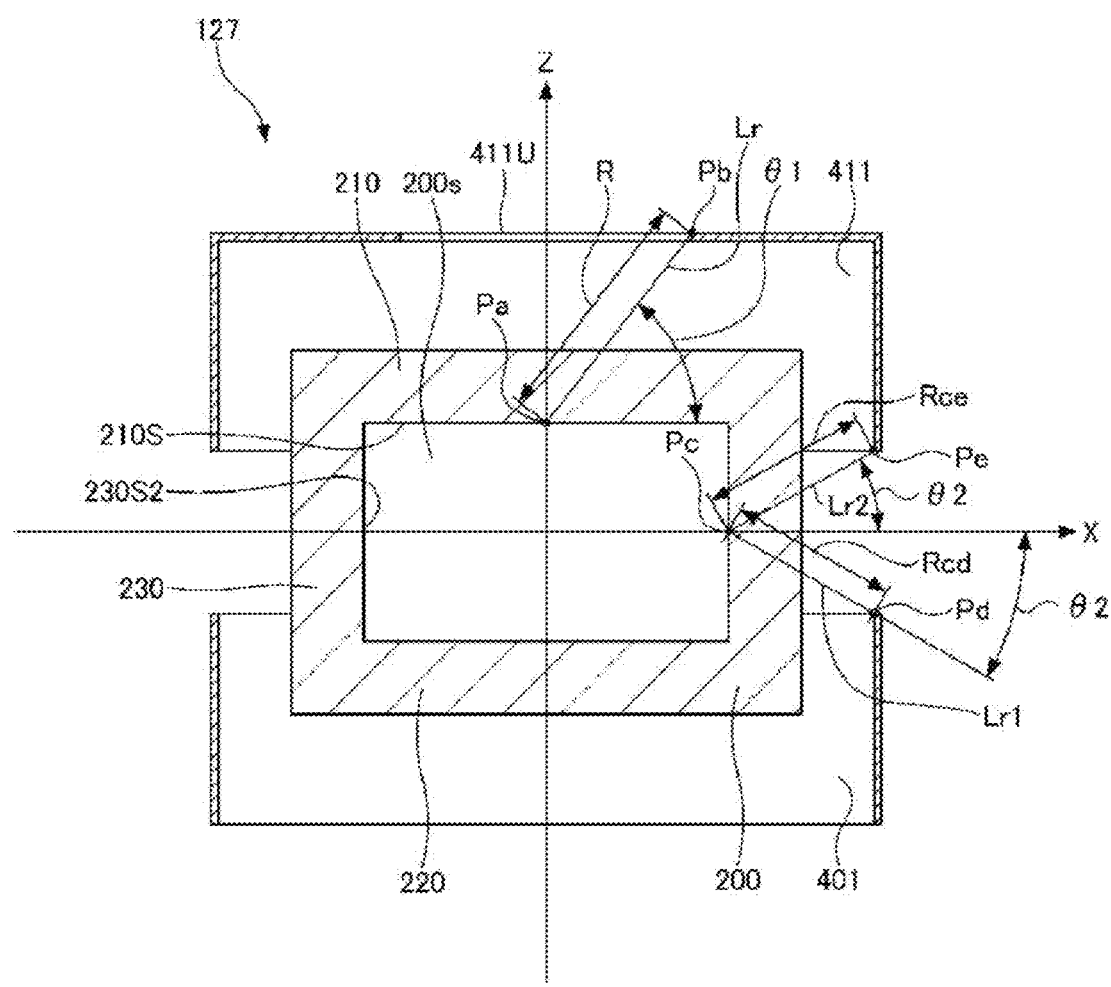
FIG. 22 is an exemplary cross-sectional view of a plasma processing apparatus according to a third embodiment.

FIG. 22 is a cross-sectional view seen from the side of the plasma processing apparatus 127 that is an example of the plasma processing apparatus according to the third embodiment.

The plasma processing apparatus 127 includes the plasma processing chamber 200, and magnetic shields 401 and 411.

The magnetic shield 411 has an opening 411U. As described in the first embodiment, the dimension of the opening 411U is set such that the angle θ1 formed by the inner surface 210S and the straight line Lr that connects the midpoint Pa of the inner surface and the end point Pb satisfies the angle θ of Eq. (3) or (5).

Further, the distance between the magnetic shield 401 and the magnetic shield 411 is set such that the angle formed by the surface parallel to the inner surface 210S passing through the midpoint Pc the straight line Lr1 that connects the midpoint Pc and the end point Pd is equal to the angle formed by the surface parallel to the inner surface 210S passing through the midpoint Pc and the straight line Lr2 that connects the midpoint Pc and the end point Pe. Such an angle is set to θ2[°] that satisfies Eq. (8) or (10).

Figure 23:
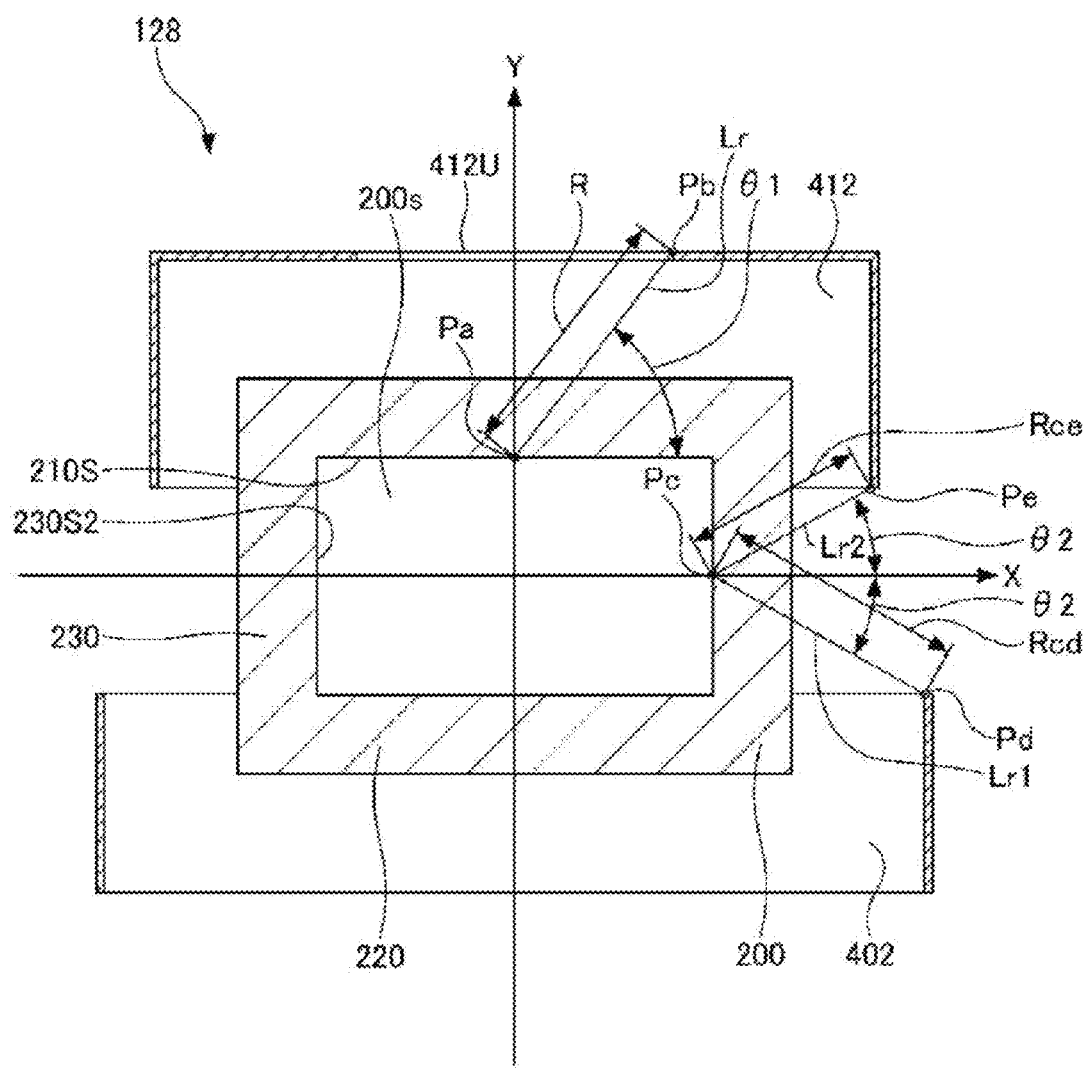
FIG. 23 is an exemplary cross-sectional view of the plasma processing apparatus according to the third embodiment.

Similarly to the magnetic shields 402 and 412 of the plasma processing apparatus 128 shown in FIG. 23, the magnetic shields 402 and 412 may have different dimensions.

(Operation and Effect)

In accordance with the magnetic shield of the plasma processing apparatus according to the present embodiment, the influence of the external magnetic field in the plasma processing apparatus can be suppressed. In particular, the influence of an external magnetic field in the plasma processing apparatus can be suppressed by covering a part of the plasma processing apparatus with the magnetic shield without covering the entire plasma processing apparatus.

Further, the embodiments of the present disclosure are illustrative in all respects and are not restrictive. The above-described embodiments may be omitted, replaced, or changed in various forms without departing from the scope of the appended claims and the gist thereof.

Although the terrestrial magnetism has been described as an example of the external magnetic field, the present invention is not limited thereto. For example, the external magnetic field may be a magnetic field leaking from an adjacent device. In the case of using the magnetic shield of the plasma processing apparatus according to the present embodiment, it is possible to obtain the same effect on the influence of the horizontal component of the leakage magnetic field.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A plasma processing apparatus comprising:
   a plasma processing chamber having an upper wall, a sidewall, and a lower wall and having therein a plasma processing space; and
   a magnetic shield disposed around an outer side of the sidewall and having an opening at an upper side thereof,
   wherein on an assumption that an angle between a line that passes through a midpoint of an inner surface of the upper wall on the plasma processing space side and connects end points of the opening and the inner surface is θ[°] and a product μi×t of an initial relative permeability μi of a magnetic material forming the magnetic shield and a thickness t[m] of the magnetic shield is Pmc[m], the angle θ[°] satisfies a condition $\theta > 764 \times Pmc^{-2} + 179 \times Pmc^{-1} + 21.3$.

2. A plasma processing apparatus comprising:
   a plasma processing chamber having an upper wall, a sidewall, and a lower wall and having therein a plasma processing space; and
   a magnetic shield disposed around an outer side of the sidewall and having an opening at an upper side thereof,
   wherein on an assumption that an angle between a line that passes through a midpoint of an inner surface of the upper wall on the plasma processing space side and connects end points of the opening and the inner surface is θ[°] and a product μi×t of an initial relative permeability μi of a magnetic material forming the magnetic shield and a thickness t[m] of the magnetic shield is Pmc[m], the angle θ[°] satisfies a condition $\theta > 4200 \times Pmc^{-2} - 96 \times Pmc^{-1} - 3.8$.

3. The plasma processing apparatus of claim 1, wherein the magnetic shield has a cylindrical shape.

4. The plasma processing apparatus of claim 2, wherein the magnetic shield has a cylindrical shape.

5. A plasma processing apparatus comprising:
   a plasma processing chamber having an upper wall, a sidewall, and a lower wall and having therein a plasma processing space; and
   a first magnetic shield and a second magnetic shield disposed at a lower side and an upper side to surround an outer side of the sidewall, respectively,
   wherein on an assumption that a first angle formed by a first line and a surface parallel to an inner surface of the upper wall on the plasma processing space side and a second angle formed by a second line and the surface parallel thereto are a third angle θ[°], the first line being a line that passes through a midpoint of an inner surface of the sidewall and connects the midpoint and an end point of an upper end of the first magnetic shield, the second line being a line that passes through the midpoint and connects the midpoint and an end point of a lower end of the second magnetic shield, and a product μi×t of an initial relative permeability μi of a magnetic material forming each of the first magnetic shield and the second magnetic shield and a thickness t[m] of each of the first magnetic shield and the second magnetic shield is Pmc[m], the third angle θ[°] satisfies a following condition:

$$\theta < 25.4 - 0.265 \times p + 8.35 \times 10^{-2} \times Pmc + (-1.58) \times p^2 + 5.87 \times 10^{-3} \times p \times Pmc + (-5.17) \times 10^{-4} \times Pmc^2.$$

6. A plasma processing apparatus comprising:
   a plasma processing chamber having an upper wall, a sidewall, and a lower wall and having therein a plasma processing space; and
   a first magnetic shield and a second magnetic shield disposed at a lower side and an upper side to surround an outer side of the sidewall, respectively,
   wherein on an assumption that a first angle formed by a first line and a surface parallel to an inner surface of the upper wall on the plasma processing space side and a second angle formed by a second line and the surface parallel thereto are a third angle θ[°], the first line being a line that passes through a midpoint of an inner surface of the sidewall and connects the midpoint and an end point of an upper end of the first magnetic shield, the second line being a line that passes through the midpoint and connects the midpoint and an end point of a lower end of the second magnetic shield, and a product μi×t of an initial relative permeability μi of a magnetic material forming each of the first magnetic shield and the second magnetic shield and a thickness t[m] of each of the first magnetic shield and the second magnetic shield is Pmc[m], the third angle θ[°] satisfies a following condition:

$$\theta < 53.2 - 0.208 \times p + 1.87 \times 10^{-2} \times Pmc + (-0.855) \times p^2 + 1.75 \times 10^{-3} \times p \times Pmc + (-1.19) \times 10^{-4} \times Pmc^2.$$

7. The plasma processing apparatus of claim 5, wherein each of the first magnetic shield and the second magnetic shield has a cylindrical shape.

8. The plasma processing apparatus of claim 6, wherein each of the first magnetic shield and the second magnetic shield has a cylindrical shape.

9. The plasma processing apparatus of claim 1, wherein the sidewall has a cylindrical shape.

10. The plasma processing apparatus of claim 2, wherein the sidewall has a cylindrical shape.

11. The plasma processing apparatus of claim 5, wherein the sidewall has a cylindrical shape.

12. The plasma processing apparatus of claim 6, wherein the sidewall has a cylindrical shape.

13. The plasma processing apparatus of claim 1, wherein the Pmc[m] is 20 [m] or more and 100 [m] or less.